(12) United States Patent
Ichikawa et al.

(10) Patent No.: US 8,382,995 B2
(45) Date of Patent: Feb. 26, 2013

(54) PIEZOELECTRIC DEVICES AND METHODS FOR MANUFACTURING SAME

(75) Inventors: Ryoichi Ichikawa, Saitama (JP); Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 192 days.

(21) Appl. No.: 12/831,142

(22) Filed: Jul. 6, 2010

(65) Prior Publication Data
US 2011/0062827 A1 Mar. 17, 2011

(30) Foreign Application Priority Data

Sep. 16, 2009 (JP) .................................. 2009-213927
Mar. 25, 2010 (JP) .................................. 2010-069440

(51) Int. Cl.
*C23F 1/00* (2006.01)

(52) U.S. Cl. .......................................... 216/2; 438/113
(58) Field of Classification Search ....... 216/2; 438/113
See application file for complete search history.

(56) References Cited

U.S. PATENT DOCUMENTS

| | | | | |
|---|---|---|---|---|
| 5,998,234 | A * | 12/1999 | Murata et al. | 438/53 |
| 7,498,723 | B2 * | 3/2009 | Tsuchido | 310/348 |
| 7,557,491 | B2 * | 7/2009 | Kigawa et al. | 310/344 |
| 2009/0174286 | A1 * | 7/2009 | Yoshimatsu et al. | 310/321 |

FOREIGN PATENT DOCUMENTS

| | | |
|---|---|---|
| JP | 10-126205 | 5/1998 |
| JP | 2000-061935 | 2/2000 |
| JP | 2002-076826 | 3/2002 |
| JP | 2004-357049 | 12/2004 |
| JP | 2006-114687 | 4/2006 |
| JP | 2006-157872 | 6/2006 |
| JP | 2006-180169 | 7/2006 |
| JP | 2006-322740 | 11/2006 |
| JP | 2007-300460 | 11/2007 |
| JP | 2009-071655 | 4/2009 |

OTHER PUBLICATIONS

Office Action for related Japanese Patent Application No. 2010-069440, 4 pages, dated Nov. 9, 2012.

* cited by examiner

*Primary Examiner* — Roberts Culbert
(74) *Attorney, Agent, or Firm* — Klarquist Sparkman, LLP

(57) ABSTRACT

Methods are disclosed for manufacturing piezoelectric devices. In an exemplary method a base substrate is prepared that defines multiple device bases. Multiple cutting grooves are defined on a surface of the base substrate in a grid pattern to define therebetween the size of the devices. A frame substrate is also prepared from a piezoelectric material. The frame substrate defines multiple frames surrounding respective vibrating pieces and being alignable with respective bases in the base substrate. Also prepared is a lid substrate defining multiple lids being alignable with respective frames and bases. The three substrates are aligned and bonded together such that the frame substrate is between the lid and base substrates and the surface defining the cutting grooves faces outward. The base substrate is mounted on a dicing sheet such that cutting grooves face the dicing sheet. Cutting is performed, using a dicing blade, through the sandwich from the lid substrate to the cutting grooves.

18 Claims, 17 Drawing Sheets

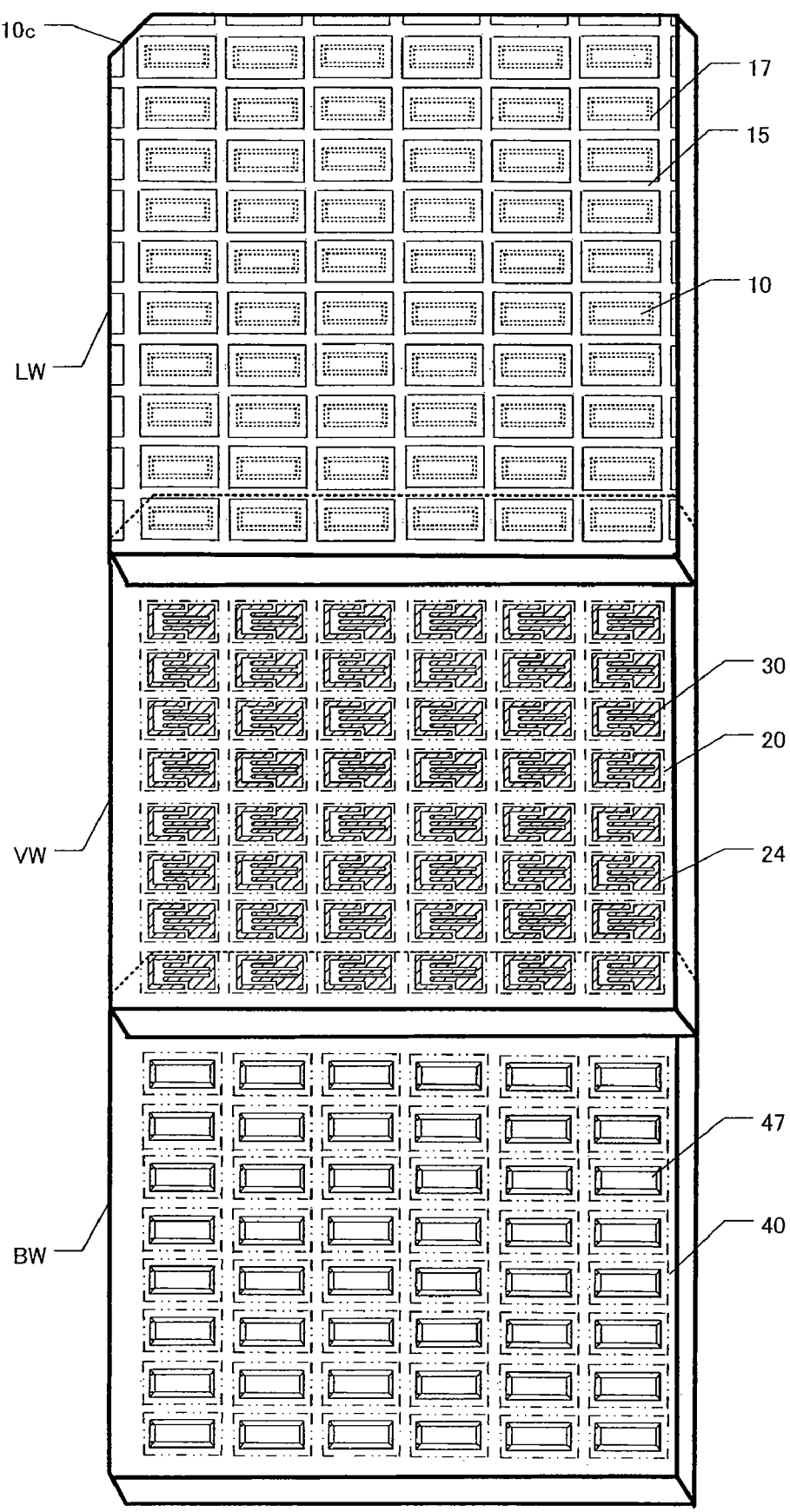

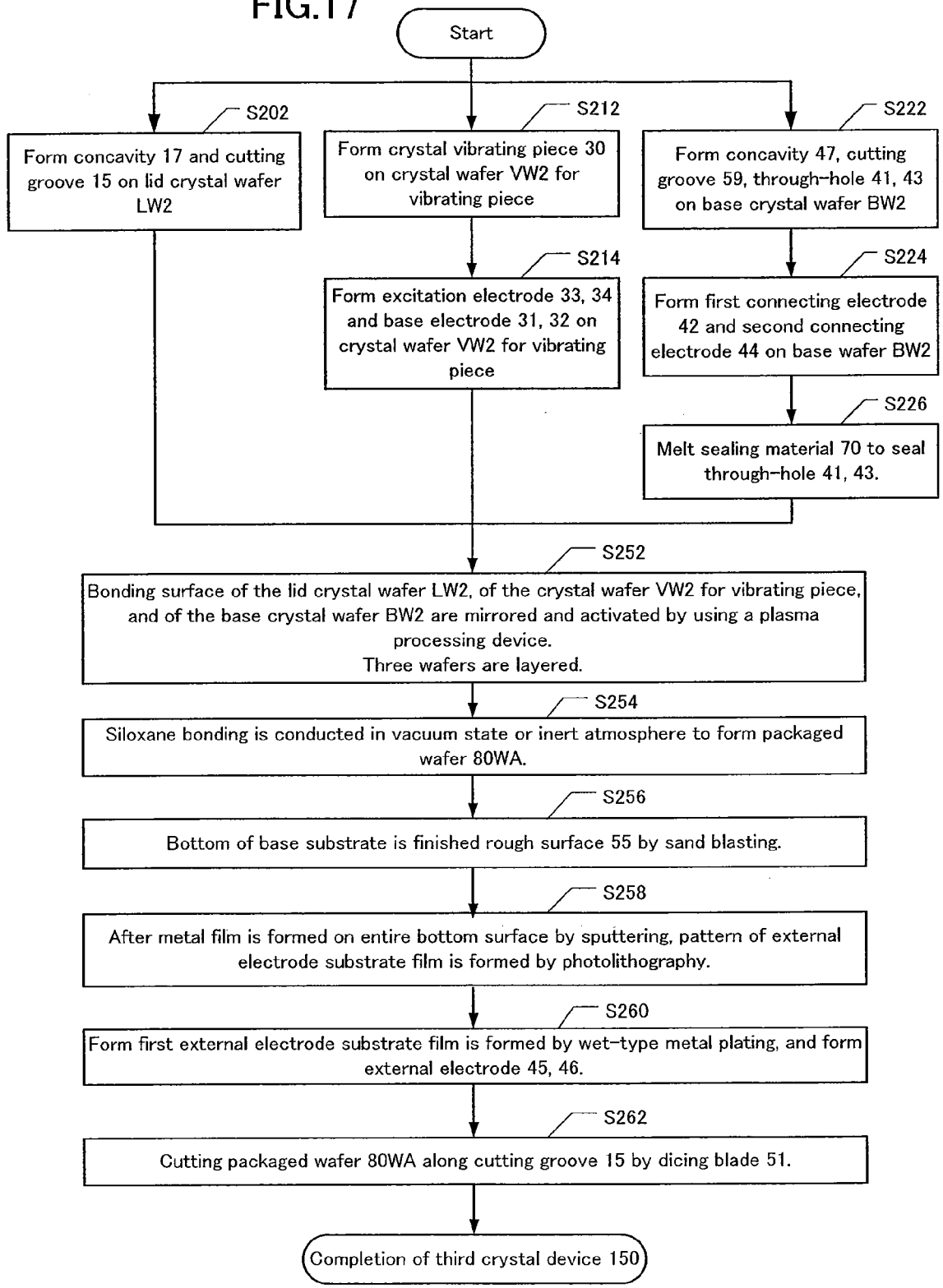

PIEZOELECTRIC DEVICES AND METHODS FOR MANUFACTURING SAME

CROSS-REFERENCE TO RELATED APPLICATION

This application claims priority to and the benefit of Japan Patent Application Nos. 2009-213927 and 2010-069440, filed on Sep. 16, 2009, and Mar. 25, 2010, respectively, in the Japan Patent Office, the disclosures of which are incorporated herein by reference in their respective entireties.

FIELD

This invention relates to, inter alia, methods for manufacturing piezoelectric devices by layering a plurality of wafers.

DESCRIPTION OF THE RELATED ART

One conventional method of cutting a crystalline material includes step-cutting, in which the material is cut in the same direction in two steps using a dual dicer. Alternatively, the material can be fully cut in one step.

When using a dicing blade of a dual dicer, the hardness of the crystalline material being cut may cause chips or cracks to develop in the crystal material as it is being sawn, or may cause fracture of the dicing blade. Japan Unexamined Patent Application No. 2006-114687 discloses a method of step cutting a crystal wafer using a dual dicer. In the method the crystal wafer is cut in two steps: "half cutting" followed by "full cutting." The cuts are made using two dicers of which the blades have the same width in the same direction. Half cutting and full cutting are conducted in the same direction so that cut resistance is better suppressed.

U.S. Pat. No. 7,498,723 discloses a method for manufacturing a piezoelectric oscillator, in which a lid wafer and a base wafer are bonded to a piezoelectric wafer, on which hundreds or thousands of piezoelectric vibrating pieces have been formed, to produce a "bonded wafer." The bonded wafer is essentially a three-wafer sandwich. In this method, a dicing blade is used for cutting the bonded wafer to detach the multiple packaged piezoelectric devices from the bonded wafer. The U.S. '723 reference does not discuss the materials of the lid wafer and base wafer. Nevertheless, the bonded wafer is cut using a dicing blade after mounting the bonded wafer to a dicing sheet (or dicing tape) using adhesive.

The bonded wafer affixed to the dicing sheet is cut into individual piezoelectric vibrators. Unfortunately, in this conventional procedure, as the bonded wafer is being cut, the dicing blade also cuts into the underlying dicing sheet. Cutting into the dicing sheet includes cutting into the adhesive adhering the bonded wafer to the dicing sheet. Cutting into the adhesive causes chipping, cracking, or other damage to the individual packages as they are being cut away from the bonded wafer.

This invention provides methods for manufacturing piezoelectric devices, in which the cutting edge of the dicing blade does not cut into the dicing sheet as the wafers are being cut into individual piezoelectric devices.

SUMMARY

A first aspect of the invention is directed to methods for manufacturing piezoelectric devices. An embodiment of such a method comprises preparing a base substrate (e.g., a base wafer), a frame substrate (e.g., a frame wafer), and a lid substrate (e.g., a lid wafer). As prepared, the base substrate defines, on one surface thereof, an array of device bases separated one from the other by cutting grooves that extend depthwise into the base substrate. Thus, the separations between adjacent cutting grooves define the size of individual device bases and hence the size of individual piezoelectric devices. As prepared, the frame substrate (made of a piezoelectric material) defines an array of device frames each being of the device size and surrounding a respective piezoelectric vibrating piece. The array of device frames on the frame substrate corresponds with the array of device bases on the base substrate. As prepared, the lid substrate defines an array of device lids each being of the device size. The array of device lids on the lid substrate corresponds with the array of device frames on the frame substrate. The frame substrate is sandwiched between the base substrate and the lid substrate, with the device bases, device frames, and device lids being aligned with each other and with the surface defining the cutting grooves facing outward. As sandwiched and aligned, the frame substrate is bonded to the base substrate and also to the lid substrate to form a package substrate. The package substrate is mounted to a dicing sheet using an adhesive, with the surface having the cutting grooves facing the dicing sheet. Using a dicing blade, cuts are made depthwise through the package substrate from the lid substrate to the cutting grooves.

By mounting the base substrate to the dicing sheet with cutting grooves facing the dicing sheet and cutting from the lid substrate only to the cutting grooves, the dicing blade does not cut through the entire thickness of the package substrate. Rather, the cut depth stops in the cutting groove, which prevents formation of burrs, chips, or cracks in the package substrate.

In another embodiment of a method for manufacturing a piezoelectric device, multiple lids are formed on a lid substrate. The lids are for respective piezoelectric devices and are separated from each other on the lid substrate by respective cutting grooves defined in a surface of the lid substrate. The cutting grooves define the size of the piezoelectric devices. Multiple frames for the piezoelectric devices are prepared on a frame substrate made of a piezoelectric material. Each frame is of the size of the devices surrounds the respective piezoelectric vibrating piece, and is alignable with a respective lid on the lid substrate. Multiple bases are formed on a base substrate. Each base is of the device size and is alignable with a respective lid on the lid substrate and with a respective frame on the frame substrate. A substrate sandwich is formed in which the frame substrate is situated between and aligned with the lid and base substrates, with the cutting grooves facing outwards. In the sandwich the frame substrate is bonded to the lid substrate and with the base substrate to form a package substrate having a thickness. After bonding the lid substrate is mounted on a dicing sheet such that the surface defining the cutting grooves faces the dicing sheet. Using a dicing blade, cuts are made through the thickness from the base substrate to the cutting grooves but without cutting the dicing sheet. Desirably, the cutting position of the dicing blade is controlled to prevent cutting completely through the thickness of the package substrate while cutting at least to a top of a cutting groove of the package substrate on the dicing sheet.

The methods are applicable for manufacturing devices of which the piezoelectric vibrating piece is a tuning-fork type piezoelectric vibrating piece or an AT-cut vibrating piece.

The methods are also applicable for manufacturing devices of which the bases and lids are made of a glass material. In such an instance the bonding step comprises anodic bonding. The methods are also applicable for manufacturing devices of which the bases and lids are made of piezoelectric materials. In such an instance the bonding step comprises siloxane bonding.

Desirably, the cutting grooves are formed by etching.

The methods are also applicable to package wafers in which the base substrate defines multiple through-holes. In such an instance, the method can include, after the bonding step, sealing the through-holes using melted eutectic metal. This sealing desirably is performed in a vacuum environment or inert-gas atmosphere.

When the cutting grooves are defined in the surface of the base substrate, the methods can also include forming the grooves with tapered portions. The methods can further comprise forming a metal film, for an external electrode of the piezoelectric device, from the surface of the base portion to the taper portion and plating the metal film to form the external electrode. If desired, the surface of the base substrate can be roughened rather than left smooth before forming the metal film. Also if desired, the metal film is not formed in regions to be cut by the dicing blade.

In other embodiments the tapered portions of the cutting grooves are formed by etching on either the lid substrate or the base substrate.

The manufacturing methods disclosed herein provide piezoelectric devices in which the probability of forming chips, cracks, or burrs when cutting individual devices from the package substrate is substantially reduced. This allows fabrication of products exhibiting increased stability and durability and provides lower reject rates of product.

BRIEF DESCRIPTION OF THE DRAWINGS

FIG. 3 is a perspective view showing a lid wafer, a frame wafer, and a base wafer being aligned and layered to form a three-wafer sandwich.

FIG. 17 is a flow-chart of a second embodiment of a method for manufacturing external electrodes in crystal devices according to the third embodiment.

DETAILED DESCRIPTION

The invention is discussed below in the context of representative embodiments that are not intended to be limiting in any way.

First Embodiment of a Crystal Device

Figure 1C:
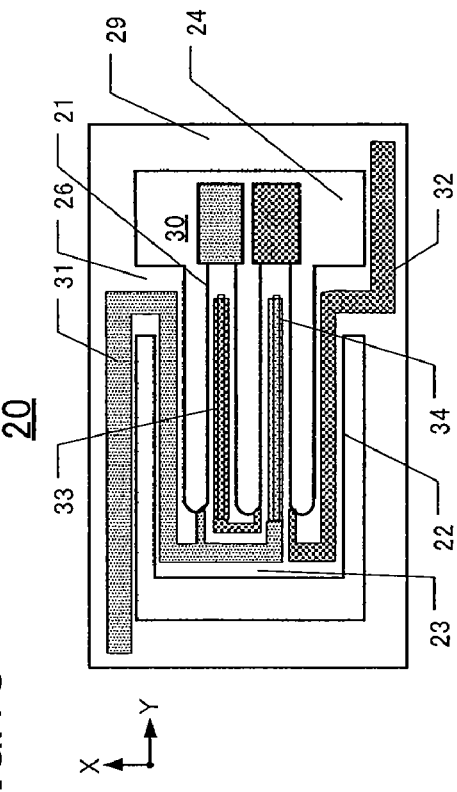
FIG. 1C is a plan view of a crystal frame comprising the tuning-fork type crystal vibrating piece.
Figure 1D:
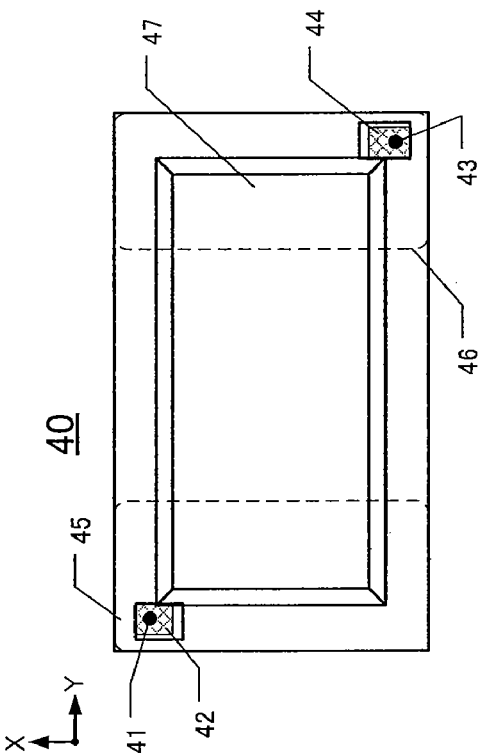
FIG. 1D is a plan view of a base for the FIG.-1A embodiment.
Figure 1A:
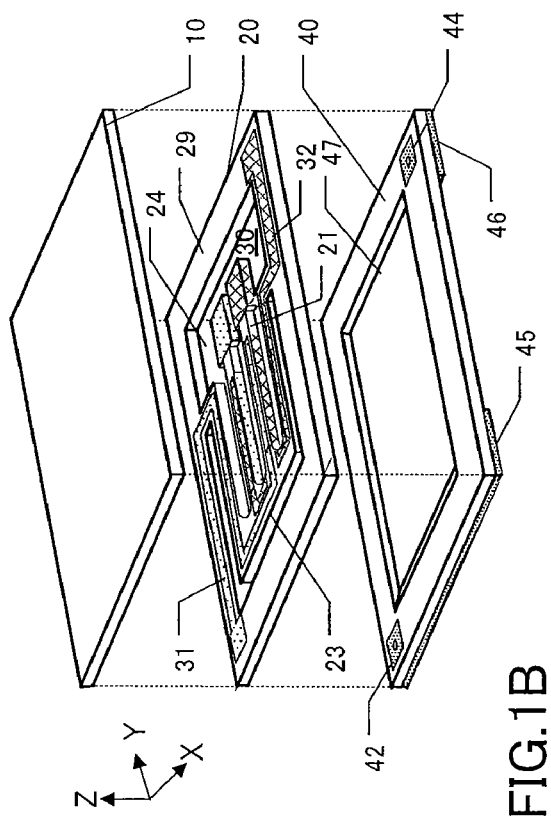
FIG. 1A is an exploded perspective view of a first embodiment of a crystal device comprising a tuning-fork type crystal vibrating piece.
Figure 1B:
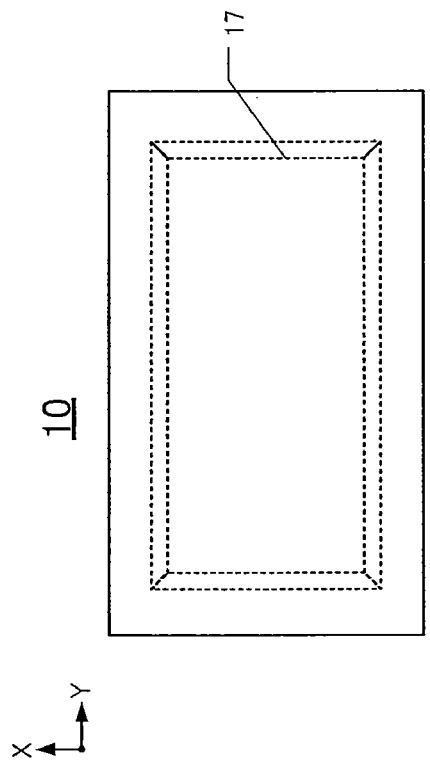
FIG. 1B is a plan view of a lid for the FIG.-1A embodiment.

FIG. 1A is a perspective view of a first embodiment of a crystal device 100, comprising a tuning-fork type crystal vibrating piece 30. The tuning-fork type crystal vibrating piece 30 comprises an outer frame portion 29 surrounding a base portion 23 and a pair of vibrating arms 21. The tuning-fork type crystal vibrating piece 30 is connected to the outer frame portion 29 by a pair of connecting portions 26 extending from a pair of supporting arms 22 to form a crystal frame 20. FIG. 1A shows in perspective the manner in which the crystal device 100 is packaged, as seen from the side of the lid 10. FIG. 1B is a plan view of the top surface of a lid 10, FIG. 1C is a plan view of a crystal frame 20 including a tuning-fork type crystal vibrating piece 30, and FIG. 1D is a plan view of the top surface of a base 40.

As shown in FIG. 1A, the crystal device 100 is a sandwich comprising a lid 10, situated top-most. The device 100 also includes the crystal frame 20 inside the sandwich, and a base 40, situated lower-most. The lid 10 and the base 40 of this embodiment are each made of a crystal material. The crystal frame 20 comprises the tuning-fork type crystal vibrating piece 30, formed therein by etching. The lid 10 and the base 40 are bonded to the crystal frame 20 by siloxane bonding (Si—O—Si).

The reason for forming the lid 10 and the base 40 from a crystal material is explained here. One of the indicators of hardness of industrial materials is the "Knoop hardness number." A higher Knoop hardness number indicates greater hardness and a lower number indicates less hardness (a softer material). The Knoop hardness number of borosilicate glass (which is commonly used for making lids and bases) is 590 kg/mm$^2$, and the Knoop hardness number of quartz crystal is 710 to 790 kg/mm$^2$. Thus, making the lid 10 and base 40 of the first crystal device 100 of quartz crystal instead of glass confers the package with a greater degree of hardness. If glass were used for making the lid 10 and base 40, the glass would have to be correspondingly thicker to provide the package with the same strength as a package made of crystal. In other words, a thinner package made of quartz has the same strength as a correspondingly thicker package made of glass. Hence, thinner-profile packages can be made of quartz crystal without sacrificing the strength of thicker packages made of glass. Therefore, whenever the lid and base are made of quartz crystal, vibrating device can have a thinner and smaller profile without sacrificing strength.

Generally, whenever a piezoelectric device is attached to a printed circuit board, heat is applied to the device. If the lid 10 and base 40 are made of a material that is not quartz crystal, the walls and interior of the piezoelectric device become highly stressed due to differences in thermal-expansion coefficient between the crystal material of the crystal device and the material of the lid and base. The larger the difference in these thermal expansion coefficients, the greater the stress, and greater stress is more likely to fracture the corners of the outer frame 29 of the crystal frame 20, which normally have low stress intensity. Thus, differences in thermal expansion coefficient between the crystal frame 20 and lid 10 and base 40 desirably are as small as practicable. It is also desirable that the lid 10 and base 40 be made of a crystal material because, compared to making these components of glass, making them of crystal material narrows the thermal expansion coefficients to that of the crystal frame 20, thereby reducing stress accumulation inside the crystal device 100. Making them of crystal also permits the crystal devices to be more miniaturized and/or provided with a thinner profile compared to crystal devices in which the lid and base are made of glass.

As shown in FIG. 1B, the lid 10 has a concavity 17 that faces the crystal frame 20 in the package. The concavity 10 is formed by wet-etching.

The tuning-fork type crystal vibrating piece 30 is located substantially in the center of the crystal frame 20, as shown in FIG. 1C. The outer frame portion 29 surrounds the piece 30. Between the tuning-fork type crystal vibrating piece 30 and the outer frame portion 29 is a void 24. The void 24 defines the outline profile of the tuning-fork type crystal vibrating piece 30, and is formed by wet-etching. The crystal frame 20 comprises the tuning-fork type crystal vibrating piece 30, the outer frame portion 29, supporting arms 22, and respective connecting portions 26. These features are formed integrally on a crystal wafer having a uniform thickness. The tuning-fork type crystal vibrating piece 30 comprises a pair of vibrating arms 21 as well as the base portion 23.

In the crystal frame 20 are a first base electrode 31 and a second base electrode 32 extending onto the outer frame portion 29 over respective portions of the base portion 23. Each vibrating arm 21 includes a first excitation electrode 33 and a second excitation electrode 34, respectively. These electrodes are formed on the upper, lower, and side surfaces of each vibrating arm 21. The first excitation electrode 33 is connected to the first base electrode 31, and the second excitation electrode 34 is connected to the second base electrode 32. The tuning-fork type crystal vibrating piece 30 is a very small vibrating piece, typically oscillating at 32.768 kHz, for example.

A respective root portion is defined by the base portion 23 and each vibrating arm 21. The two supporting root portions formed by the base portion 23, the vibrating arms 21, and the supporting arms 22 are U-shaped. The vibrating arms 21 and the supporting arms 22 each have the same length, and the spaces between adjacent arms have the same width. Also, the root portions each have the same shape, and the base portions each have the same length. As a result, the tuning-fork type crystal vibrating piece 30 is symmetric and well-balanced as a vibrating structure.

Each vibrating arm 21 becomes wider at its distal end, forming a respective hammer-head portion having a constant width. The hammer-head portions are actually weights made of respective metal films. The first base electrode 31, second base electrode 32, first excitation electrode 33, and second excitation electrode 34 are each formed of a layer of chromium (Cr) having a thickness of 150 Å to 700 Å and a layer of gold (Au) having a thickness of 400 Å to 2000 Å. Instead of chromium (Cr) layer, a layer of titanium (Ti) can be used, and a silver (Ag) layer can be used instead of the gold (Au) layer.

The supporting arms 22 extend from the base portion 23 in the Y-direction, parallel to the vibrating arms 21, and connect to respective connecting portions 26. The connecting portions 26 connect to the outer frame 29. The supporting arms 22 reduce vibration leakage from the vibrating arms 21 to the exterior of the crystal device 100. The supporting arms 22 also reduce adverse effects of exterior temperature changes or dropping impacts.

As shown in FIG. 1D, the base 40 has a concavity 47 that faces the crystal frame 20. Concurrently with forming the concavity 47 on the base 40, a first through-hole 41 and a second through-hole 43 are also formed, by etching. A first connecting electrode 42 and a second connecting electrode 44 are formed on the supper surface of the base 40. As shown in FIG. 1A, a first external electrode 45 and a second external electrode 46 are formed on the lower surface of the base 40, where they are metalized.

Respective metal films are formed inside the first through-hole 41 and the second through-hole 43. The metal films are formed concurrently with forming the connecting electrodes 42, 44 in a photolithography step. The first connecting electrode 42 is connected via the metal film of the first through-hole 41 to the first external electrode 45 formed on the lower surface of the base 40. Similarly, the second connecting electrode 44 is connected via the metal film of the second through-hole 43 to the second external electrode 46 formed on the lower surface of the base 40.

The first base electrode 31 and the second base electrode 32 formed on the lower surface of outer frame portion 29 are connected, respectively, to the first connecting electrode 42 and the second connecting electrode 44 formed on the supper surface of base 40. Thus, the first base electrode 31 is electrically connected to the first external electrode 45, and the second base electrode 32 is electrically connected to the second external electrode 46.

In FIGS. 1A-1D, one crystal device 100 is shown for explanation purposes. However, during actual manufacturing of these devices, hundreds or thousands of crystal frames 20 are formed on a single crystal wafer. Hence, a crystal frame wafer (a desired form of "frame substrate") defines hundreds or thousands of crystal frames 20, a lid wafer (a desired form of "lid substrate") defines hundreds or thousands of lids, and a base wafer (a desired form of "base substrate") defines hundreds or thousands of bases. These three wafers are sandwiched, with the crystal-frame wafer as the middle wafer, and bonded together by siloxane bonding. The bonded wafers are then cut into individual crystal devices 100 using a dicing saw.

Figure 2A:
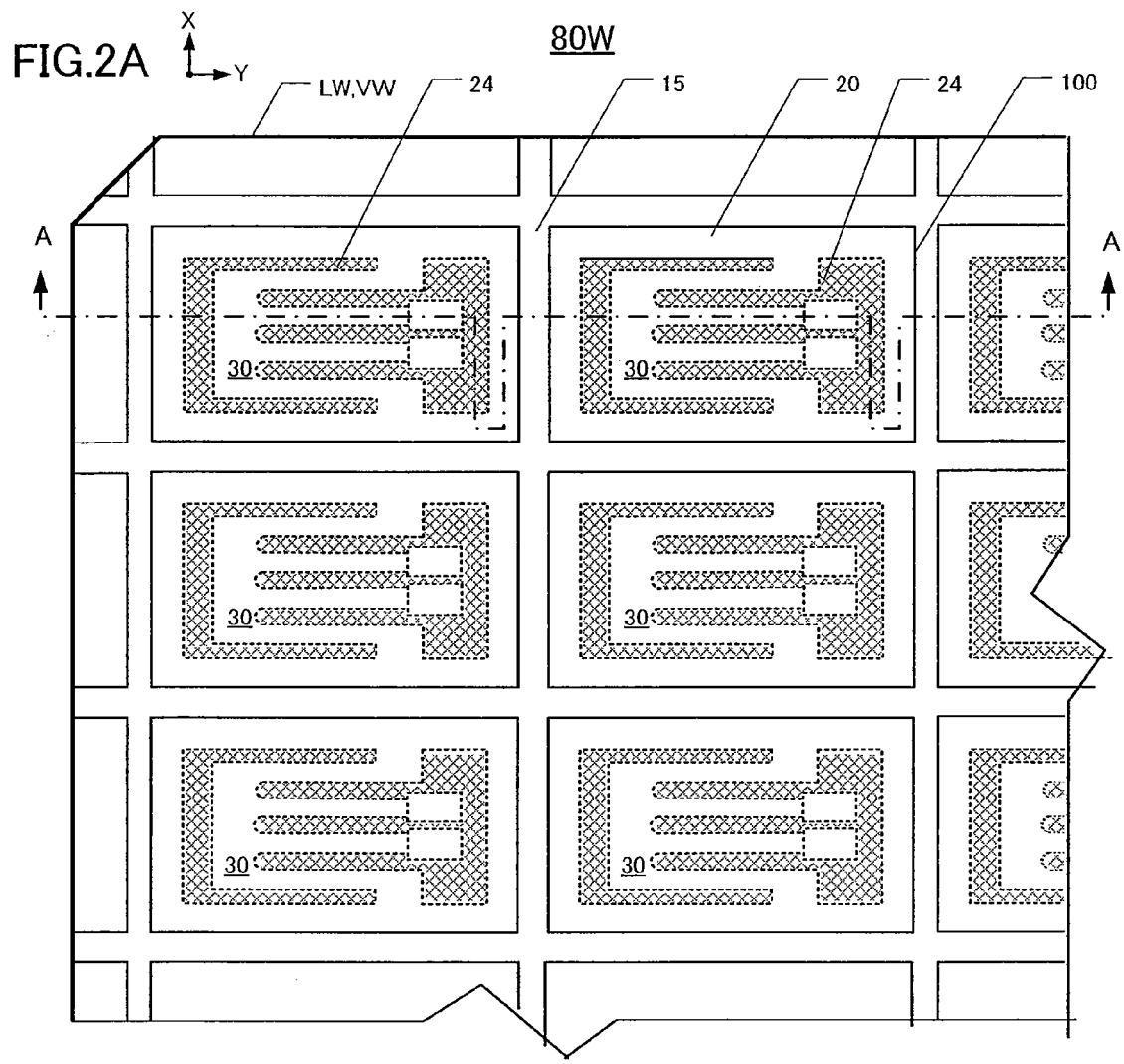
FIG. 2A is a plan view of a package wafer, viewed from above the lid wafer, on which multiple crystal devices are formed simultaneously by a first embodiment of a method according to the invention.
Figure 2B:
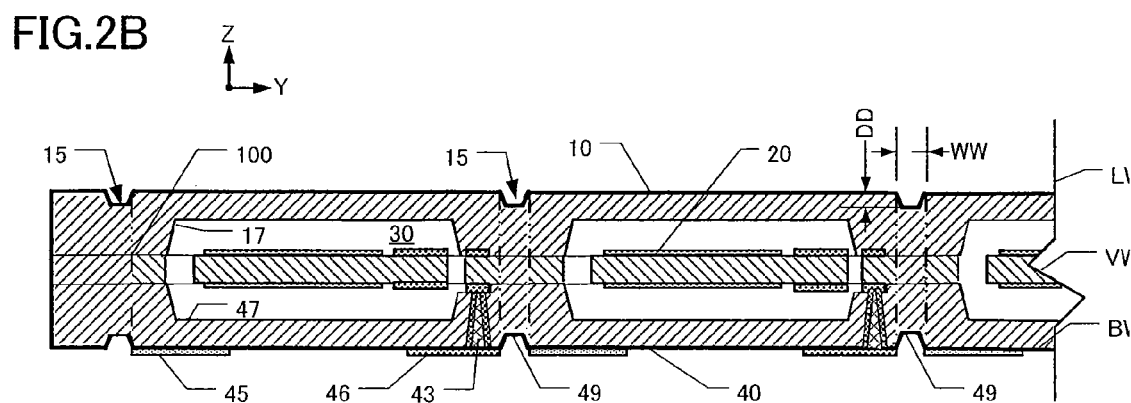
FIG. 2B is a cross-sectional (elevational) view along the line A-A in FIG. 2A.

FIG. 2A is a plan view of a bonded wafer sandwich 80W (also called "package wafer") as seen from the lid wafer LW. FIG. 2B is a cross-sectional view along the line A-A of the package wafer 80W. Particularly, FIG. 2A shows that the lid wafer LW is transparent (the respective tuning-fork type crystal vibrating pieces 30 formed on the underlying frame wafer VW are visible). For better understanding, the outline profile of the tuning-fork type crystal vibrating pieces 30 of the respective crystal frames 20 are drawn as dotted lines, and the voids 24 are shown as shaded areas in FIG. 2A.

Further with respect to FIG. 2A, cutting grooves 15 are formed in a grid pattern on the outside surface of the lid wafer LW; thus, the cutting grooves define the sizes of individual crystal devices 100. The cutting grooves 15 are formed so as to avoid cracks in the crystal devices 100 whenever they are being cut using a dicing blade. A dicing blade moves linearly; consequently, the cutting grooves 15 on the lid wafer LW are positioned on the periphery of each crystal device 100.

FIG. 2B is a cross-sectional view of the package wafer 80W comprising multiple crystal devices 100. As shown in FIG. 2B, the package wafer 80W comprises the lid wafer LW, a crystal frame wafer VW, and a base wafer BW. The lid wafer LW and the base wafer BW each have a thickness of 100 μm to 150 μm. Each of these two wafers also has respective cutting grooves 15, 49 defining the sizes of the piezoelectric devices. In FIG. 2B the size of each crystal device 100 of the package wafer 80W is indicated by virtual lines or a double line for a better understanding.

Whenever the concavities 17 are being formed on the lid wafer LW by wet-etching, the cutting grooves 15 are simultaneously being formed in a grid pattern on the outside surface of the lid wafer LW, in regions in which concavities 17 are not being formed. Similarly, whenever the concavities 47 are being formed on the base wafer BW by wet-etching, the cutting grooves 49 are simultaneously being formed in a grid pattern on the outside surface of the base wafer BW, in regions in which the concavities 47 are not being formed. The depth of each cutting groove 15, 49 is in a range of 20 μm to 100 μm. The width of each cutting groove 15, 49 is substantially equal to or slightly wider than the thickness of the cutting edge of a dicing blade, as discussed later. Since the cutting grooves 15, 49 are formed by wet-etching, their widths increase from center to outward in the Z-direction. Thus, the cutting grooves 15, 49 have tapered sides.

The cutting grooves 15, 49 formed on respective surfaces of the lid wafer LW and the base wafer BW reduce the cutting burden imposed on the dicing blade, thereby improving work efficiency. To solve problems of chipping or cracking of a package wafer during dicing, as caused by adhesion of the adhesive on the dicing sheet to the dicing blade, the cutting grooves desirably are cut only while the package wafer 80 is mounted to a major surface of the dicing sheet. That is, the cutting grooves 15 desirably are cut on the surface of the lid wafer LW while the package wafer 80 is affixed (via the base wafer) to the dicing sheet by adhesive. The cutting grooves 49 desirably are cut on the surface of the base wafer BW while the package wafer 80 is affixed (via the lid wafer LW) to the dicing sheet by adhesive.

Manufacturing the Crystal Device 100

FIG. 3 is a perspective view before forming a sandwich of the lid wafer LW, the crystal frame wafer VW, and the base wafer BW. For purposes of explanation, the lids 10 are shown on the lid wafer LW, the crystal frames 20 are shown on the crystal frame wafer VW, and the bases 40 are shown on the base wafer BW as dotted-virtual lines. The voids 24 are shown as shaded areas to distinguish them from the crystal frames 20 and from the tuning-fork type crystal vibrating pieces 30 on the crystal frame wafer VW.

At the time the above-mentioned three wafers are layered to form the sandwich (package wafer 80), the concavities 17 and cutting grooves 15 have already been formed on respective surfaces of the lid wafer LW by wet-etching using hydrogen fluoride. Similarly, the concavities 47 and the cutting grooves 49 have already been formed on respective surfaces of the base wafer BW by wet-etching using hydrogen fluoride. Also formed at this time are the first connecting electrodes 42 and the second connecting electrodes 44. Also formed are the first base electrodes 31, the second base electrodes 32, the first excitation electrodes 33, and the second excitation electrodes 34 on the tuning-fork type crystal vibrating pieces 30. The bonding surfaces of the lid wafer LW, the crystal frame wafer VW, and the base wafer BW are plasma-treated or irradiated with an ion beam to mirror-surface polish them. Then, the bonding surfaces are activated in preparation for bonding.

The activated bonding surfaces of the respective crystal wafers have a diameter of four inches each, for example. The respective crystal wafers have respective orientation flats 10c for aligning the wafers with each other. After the bonding surfaces of the lid wafer LW, the crystal frame wafer VW, and the base wafer BW have been layered and aligned with each other, they are pressed together and heated to 100° C. to 200° C. in air to bond them strongly to each other in a sandwich by siloxane bonding. Thus, a package wafer 80 is formed on which multiple crystal devices 100 have been formed. Also strongly bonded together during this siloxane-bonding step are the first base electrodes 31 to respective first connecting electrode 42 and the second base electrodes 32 to respective second connecting electrodes 44.

After forming the package wafer 80W comprising multiple crystal devices 100, the first through-holes 41 and the second through-holes 43 of the devices (see FIGS. 1 and 2) are sealed in a vacuum or inert gas atmosphere. Afterward, the package wafer is cut using a dicing blade into individual crystal devices 100. The manner in which these cuts are made is explained by referring to FIGS. 4A-4C and 5A-5B.

Figure 4A:
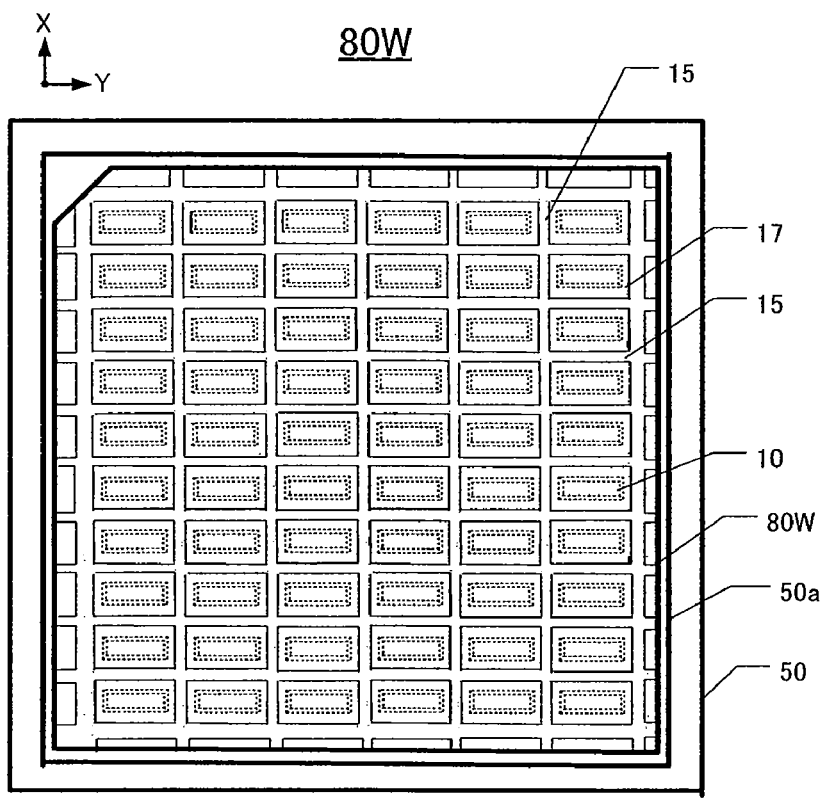
FIG. 4A is a plan view of the package wafer produced by stacking, aligning, and bonding together the lid wafer, frame wafer, and base wafer according to the first method embodiment. The package wafer is shown mounted on a dicing sheet.
Figure 4B:
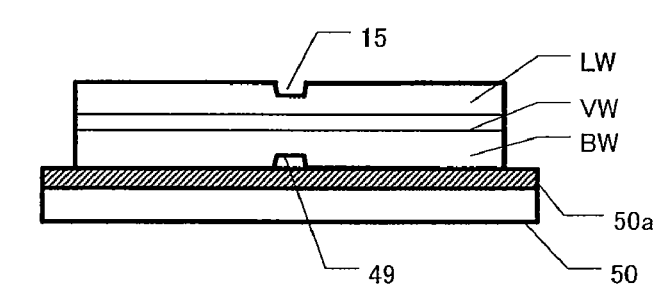
FIG. 4B is a schematic elevational view of a portion of the package wafer mounted on the dicing sheet.
Figure 4C:
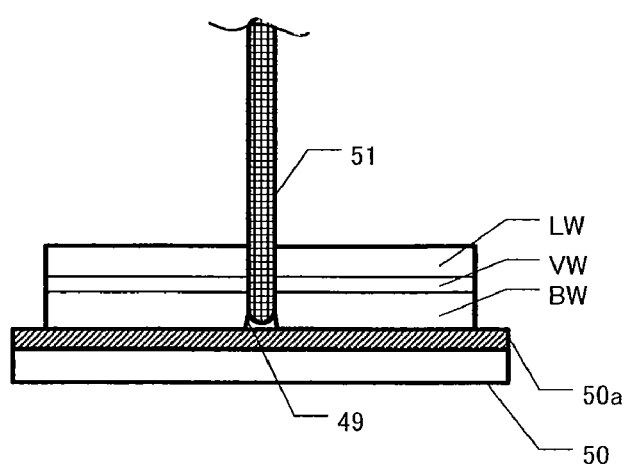
FIG. 4C is a schematic elevational view of a portion of the package wafer being cut in a cutting groove by a dicing blade.

FIG. 4A is a top view of the package wafer 80W as mounted to a dicing sheet 50. FIG. 4B is a schematic elevational view of the package wafer 80W mounted on the dicing sheet 50. FIG. 4C is a schematic elevational view of the package wafer 80W being cut in a cutting groove 49. As shown in FIG. 4A, the package wafer 80W (containing multiple crystal devices 100) is mounted on a dicing sheet 50 and fixed thereon by an adhesive 50a. The adhesive 50a bonds the base wafer BW of the package wafer 80W to the dicing sheet 50. By being formed on the lid wafer LW in a grid pattern, the cutting grooves 15 define the length and width of each of the piezoelectric devices to be cut from the package wafer 80.

As shown in FIG. 4B, the cutting grooves 49 on the base crystal wafer BW are not contacted by the adhesive 50a. As a result, a void having a height in a range of 20 µm to 100 µm is situated between the bottom surface of each cutting groove 49 and the top surface of the adhesive 50a. FIG. 4C schematically shows the package wafer 80W being cut along a cutting groove 49 using a dicing blade 51, as part of the cutting regimen to form individual crystal devices 100 from the package wafer 80. In this process, the vertical position of the cutting edge of the dicing blade 51 is controlled so as not to touch the dicing sheet 50. The cutting grooves 49 are formed on the base wafer BW. As a result of the void between the bottom surface of the cutting groove 49 and the top surface of the adhesive 50a, the cutting grooves 49 face the dicing sheet 50, and the edge of the dicing blade 51 cuts the package wafer 80W without touching the dicing sheet 50.

Cutting of Crystal Devices

Figure 5A:
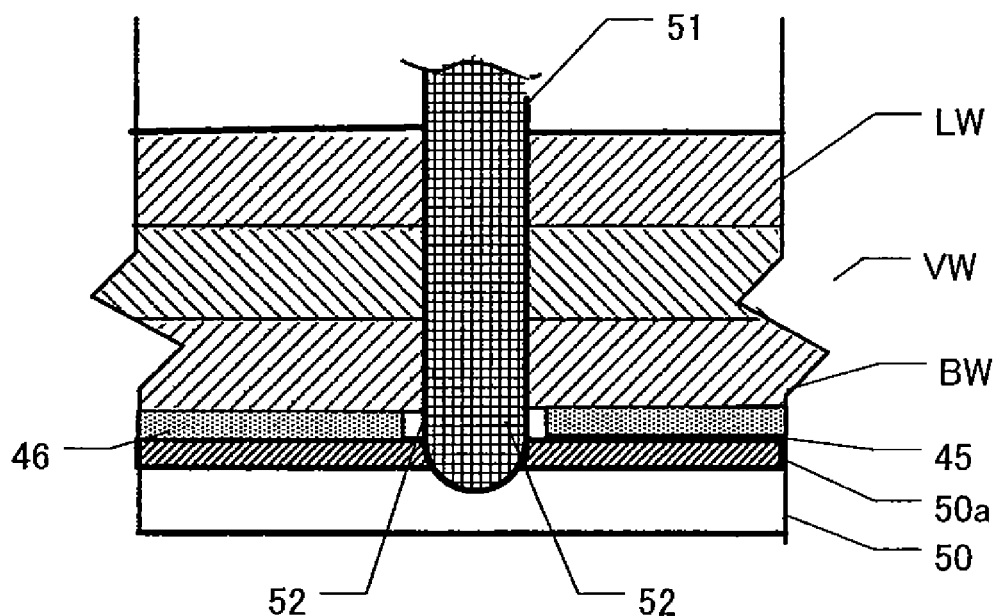
FIG. 5A is a enlarged elevational view showing further detail of a portion of the package wafer being cut in a cutting groove by a dicing blade. A portion of the dicing sheet is also shown.
Figure 5B:
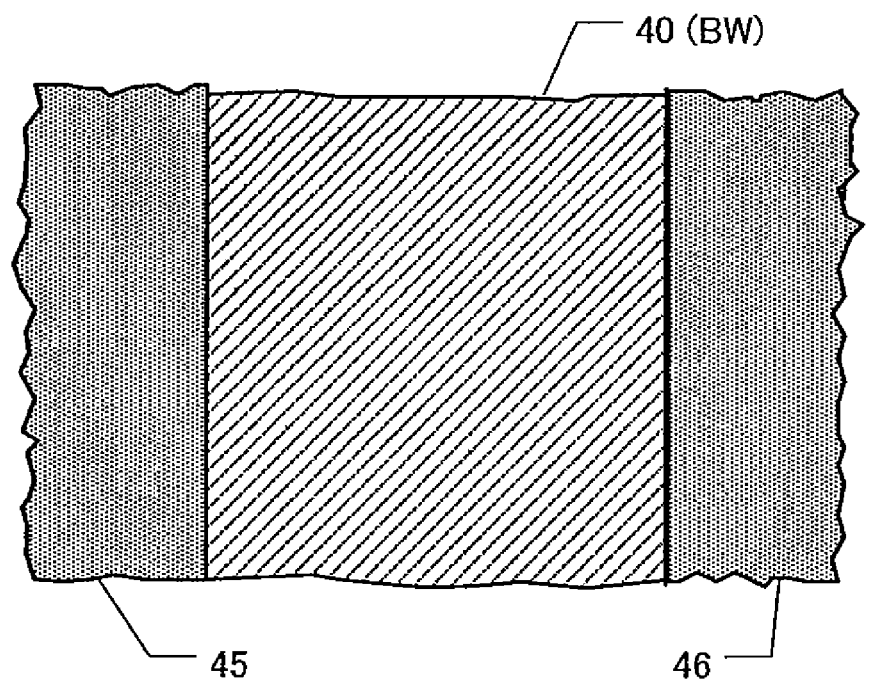
FIG. 5B is a plan view of a portion of the base wafer after having been cut in the manner shown in FIG. 5A.

Described below are the results of experiments involving cutting the package wafer 80W using a dicing blade 51 while controlling the cutting depth of the blade 51. See also FIGS. 5 and 6. FIG. 5A shows the cutting status of the dicing sheet 50 and the package wafer 80W being cut by the dicing blade 51. FIG. 5B is a plan view of a region on the base wafer BW that is being cut in the manner shown in FIG. 5A. In FIG. 5A, if the edge of the dicing blade 51 cuts into the adhesive 50a and the dicing sheet 50, portions of the cut adhesive 50a and dicing sheet 50 adhere to the edge of the dicing blade 51. More specifically, cut-adhesive debris and granules of crystal material adhering to the adhesive debris adhere to and rotate with the dicing blade 51. The granules of crystal adhering to the blade behave as cutting debris and tend to cut into the base wafer BW. As a result, as shown in FIG. 5B, the crystal device 100 on the surface of the base 40 (or surface of the base wafer BW) being cut becomes chipped or cracked. Crystal devices 100 having such chips or cracks may cause product failure. To avoid generating these abrasive granules from cutting the package wafer 80W, the cutting edge of the dicing blade 51 is positionally controlled so as not to extend into the adhesive 50a.

Figure 6A:
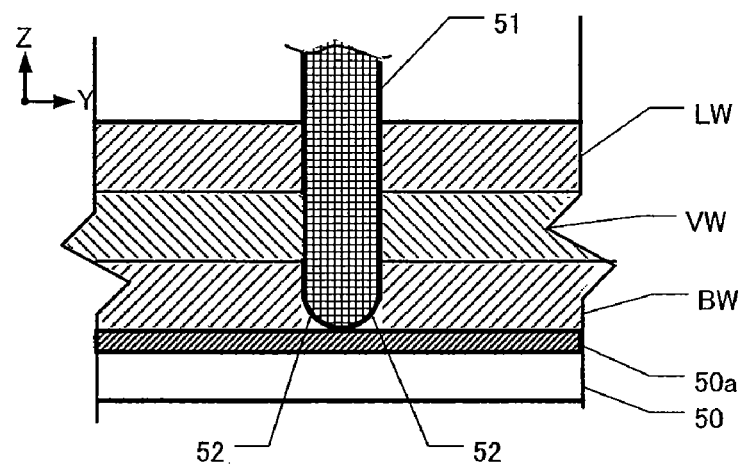
FIG. 6A is an elevational section of a portion of the package wafer being cut using a dicing blade but without cutting grooves.
Figure 6B:
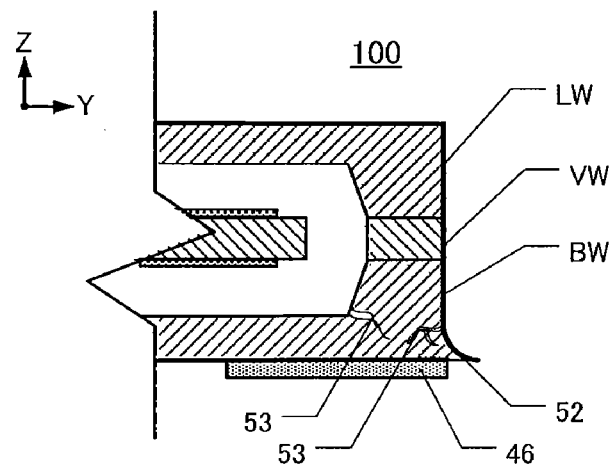
FIG. 6B is an elevational section of a portion of the package wafer after having been cut in the manner shown in FIG. 6A.

FIG. 6A shows the dicing blade 51 cutting the package wafer 80W without touching the adhesive 50a on the dicing sheet 50. The package wafer 80W shown in FIG. 6A lacks a cutting groove 49. In FIG. 6B the crystal wafer 100 is being cut in the manner shown in FIG. 6A, and in FIG. 6C the crystal wafer 100 is being cut in the manner shown in FIG. 4C. Referring first to FIG. 6A, the dicing blade 51 is positioned to cut the package wafer 80W without the cutting edge of the dicing blade 51 contacting the adhesive 50a. Generally, the cutting edge of the dicing blade 51 is rounded due to repeated usage, especially use in cutting hard-crystal wafers. If a crystal device 100 is cut, from the lid-wafer side toward the base-wafer side using a dicing blade having a rounded edge, some regions of the cuts remain as uncut burrs 52 and the like, which essentially are protrusions of the crystal material.

Whenever the package wafer is being cut according to FIG. 6A, the burrs 52 are formed on the base side (i.e., the base-wafer side) of the crystal vibrating device 100 (FIG. 6B). The burrs 52 cause formation of cracks 53, which constitute breaches in the integrity of the package. These breaches can result in degradation of the atmosphere inside the package and/or can cause gas leakage from inside the package, which degrade the operating life and/or performance of the crystal device 100.

Figure 6C:
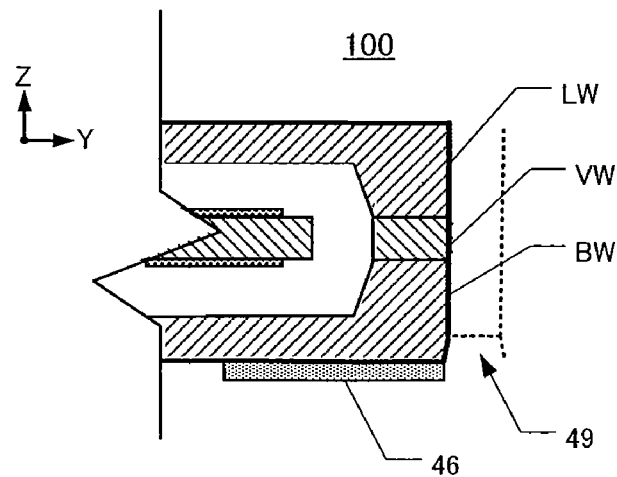
FIG. 6C is an elevational section of a portion of the package wafer after having been cut in the manner shown in FIG. 4C, wherein the package wafer included cutting grooves.

In FIG. 6C, the cutting groove 49 is indicated using dotted lines. As a result of the cutting groove 49 being formed on the base wafer BW, the edge of the dicing blade 51 can cut the package wafer 80 without touching the dicing sheet 50. Also, the burr 52 shown in FIG. 6B is not formed and residual cutting debris is not generated. Note in the figure that, as cut, the cutting groove 49 has tapered side surfaces instead of a burr 52.

Second Embodiment of a Crystal Device 120

FIGS. 7A-7D are schematic views of a second embodiment of a crystal device 120 comprising an AT-cut crystal vibrating piece 65. Generally, an AT-cut crystal vibrating piece 65 is used in a piezoelectric vibrating device that produces high-frequency oscillations. As an AT-cut crystal vibrating piece 65 oscillates the upper and lower surfaces of the crystal vibrating piece move in opposite directions to generate higher oscillation frequencies. The oscillation frequency depends upon the thickness of the crystal vibrating piece, wherein the frequency is inversely proportional to the thickness.

Figure 7A:
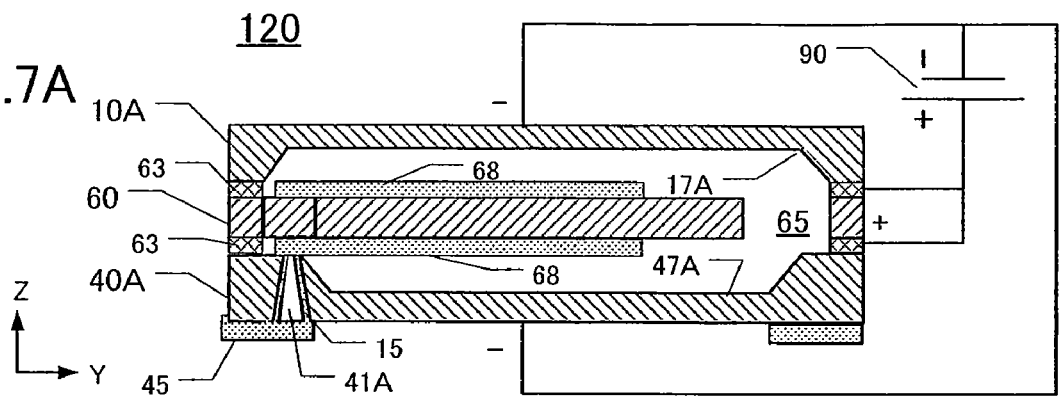
FIG. 7A is a simplified elevational section of a portion of a vibrating device formed according to a second embodiment. The view shows anodic bonding being conducted.
Figure 7B:
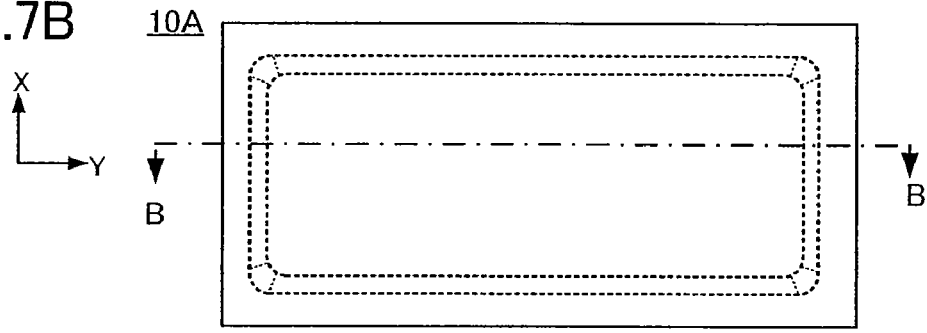
FIG. 7B is a plan view of the top (outside) surface of a lid of the device of FIG. 7A.
Figure 7C:
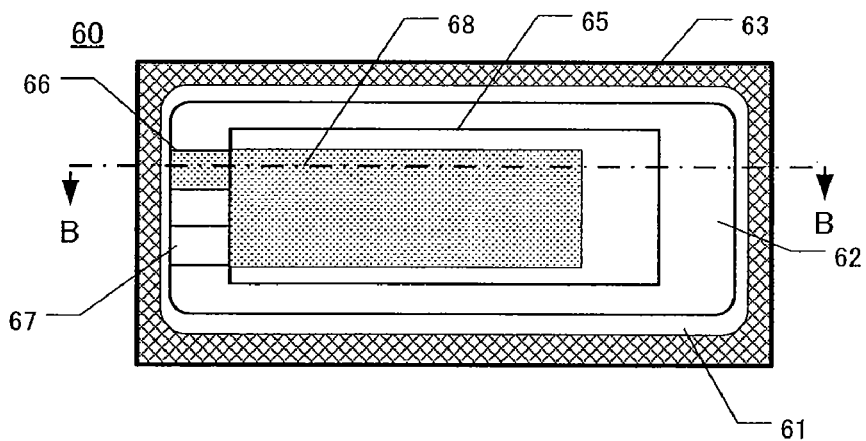
FIG. 7C is a plan view of the top surface of a crystal frame of the device of FIG. 7A.
Figure 7D:
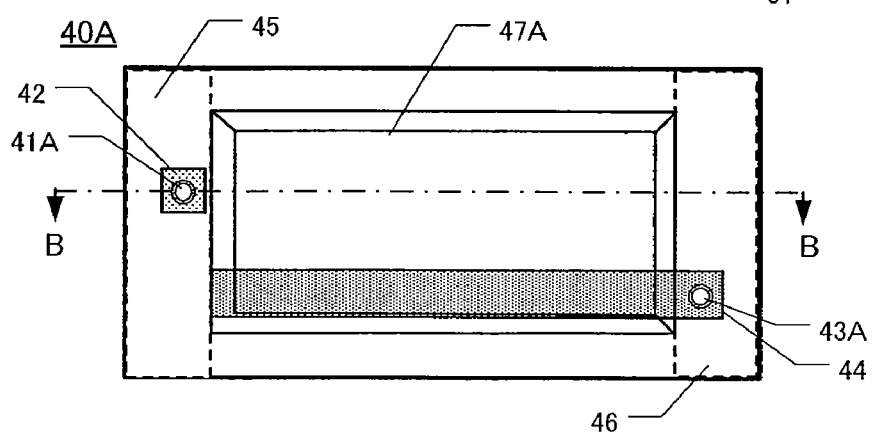
FIG. 7D is a plan view of the top (inside) surface of a base of the device of FIG. 7A.

FIG. 7A is a simplified cross-sectional view of anodic bonding being performed on the crystal device 120. FIG. 7B is a plan view of the lid 10A of the device; FIG. 7C is a plan view of the crystal frame 60 of the device; and FIG. 7D is a plan view of the base 40A of the device. The section shown in FIG. 7A is along the line B-B of FIGS. 7B-7D in which the lid 10A, the base 40A, and crystal frame 60 are bonded together by anodic bonding to form the packaged crystal device 120. The crystal frame 60 is in the center of a sandwich, with the base 40A being bonded to the lower surface of the crystal frame 60, and the lid 10A (including a concavity 17A) is bonded to the upper surface of the crystal frame 60 to form the crystal device 120.

The lid 10A and base 40A shown in FIGS. 7B and 7C are made of Pyrex® glass, borosilicate glass, or the like, and contain metal ions such as sodium ions. The lid 10A has a concavity 17A that faces the crystal frame 60. The base 40A has a concavity 47A that faces the crystal frame 60. The crystal frame 60 has an AT-cut crystal vibrating piece 65 formed by crystal etching.

The crystal frame 60 shown in FIG. 7C comprises the AT-cut crystal vibrating piece 65 and an outer frame 61 surrounding the vibrating piece 65. A void 62 is situated between the AT-cut crystal vibrating piece 65 and the outer frame 61. The AT-cut crystal vibrating piece 65 includes connecting electrodes 66, 67 and an excitation electrode 68. The connecting electrodes 66, 67 and excitation electrode 68 each include a gold (Au) layer of 400 Å to 2000 Å thickness formed on a chromium (Cr) layer of 150 Å to 700 Å thickness. The outer frame 61 of the crystal frame 60 includes a metal film 63 both on its upper and lower surfaces. The metal film 63 is formed by sputtering or vacuum deposition. The metal film 63 includes an aluminum (Al) layer having a thickness of 1000 Å to 1500 Å.

As shown in FIG. 7D, the base 40A includes a concavity 47A that faces the crystal frame 60. As the concavity 47A of the base 40A is being formed, a first through-hole 41A and a second through-hole 43A are formed concurrently. A first connecting electrode 42 and a second connecting electrode 44 are formed on the upper surface of the base 40A. A first external electrode 45 and a second external electrode 46 are formed on the lower surface of the base 40A.

The lid 10A having the concavity 17A and the base 40A having the concavity 47A sandwich the crystal frame 60 comprising the AT-cut crystal vibrating piece 65, so as to form the crystal device 120 of this embodiment. Next, the crystal device 120 is heated to 200° C. to 400° C. in air and pressurized. Then, the upper surface of the lid 10A is connected to a negative potential, while the upper surface of the outer frame 61 and the lower surface of the metal film 63 are connected to a positive potential. A potential of 400 Vdc from a source 90 is applied for 10 minutes to achieve anodic bonding.

The first through-hole 41 and second through-hole 43 of this crystal device 120 are filled with respective eutectic metal balls having relatively smaller individual volumes than the volume of the respective through-holes. The through-holes are sealed in a vacuum or inert-gas atmosphere. After sealing of the through-holes, the crystal devices 120 are cut into individual devices using a dicing blade or a laser saw.

Note that the crystal device 120 shown in FIG. 7A is shown with only one lid 10A, one base 40A, and one crystal frame 60 comprising an AT-cut crystal vibrating piece 64. However in an actual manufacturing process, hundreds or thousands of devices are formed on each crystal wafer, as shown in FIG. 8.

If a crystal material rather than glass is used for fabricating the lid 10A and base 40A, AT-cut lids and bases can be bonded to the crystal frames 60 by siloxane bonding.

Method for Manufacturing the Crystal Device 120

Figure 8:
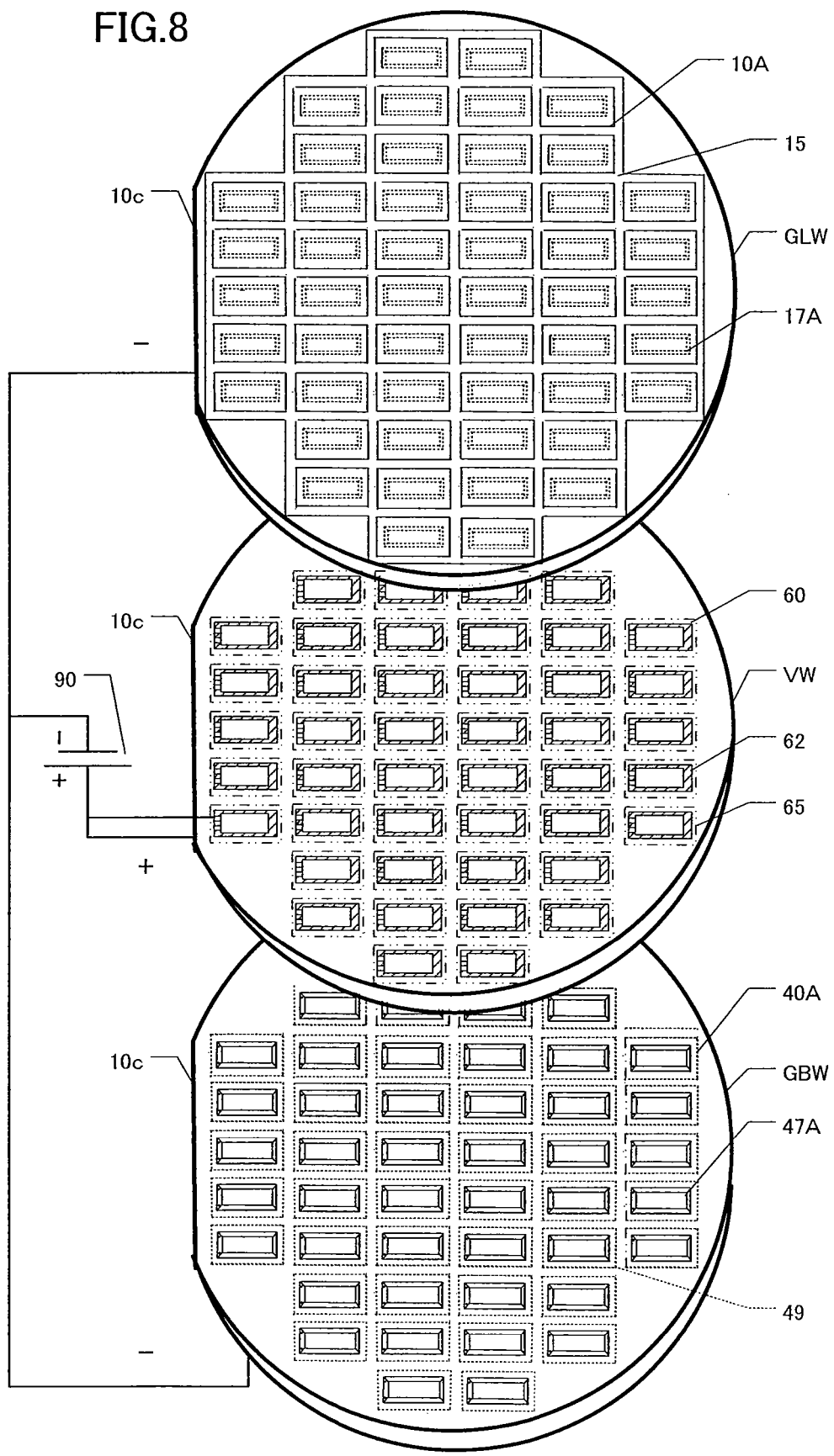
FIG. 8 is a perspective view showing a glass lid wafer, a crystal frame wafer, and a glass base wafer being aligned and layered to form a package wafer. Also shown are electrical connections for performing bonding of the wafers together.

FIG. 8 is a perspective view showing a glass lid wafer GLW, a crystal wafer VW (including multiple vibrating pieces), and a glass base wafer GBW are layered relative to each other before being bonded together as a sandwich. The lid wafer GLW has concavities 17A, the crystal wafer VW defines multiple AT-cut crystal vibrating pieces 65 and metal films 63, and the base wafer GBW has concavities 47.

The cutting grooves 15, the concavities 17, and the lids 10A are formed on the lid wafer GLW. The concavities 17 are indicated by dotted lines. At the time the three wafers GLW, VW, GBW are layered, the concavities 17A and the cutting grooves 15 have already been formed by etching. The base wafer BGW includes cutting grooves 49, the concavities 47A, and the bases 40A. The cutting grooves 49 are indicated by dotted lines. At the time the three wafers GLW, VW, GBW are layered, the concavities 47 and the cutting grooves 49 have already been formed by etching. For convenience of explanation, the crystal frames 60 are shown as virtual lines on the crystal wafer VW. Also, voids 62 are indicated as shaded areas for distinguishing the AT-cut crystal vibrating pieces 65 and their respective crystal frames 60. Also shown in FIG. 8 is a circuit diagram indicating connections used for anodic bonding.

The crystal wafer VW comprises the AT-cut crystal vibrating pieces 65 and the metal films 63. As shown in FIGS. 7A and 7C, an excitation electrode 68 and connecting electrodes 66, 67 are formed on each AT-cut crystal vibrating piece 65.

The lid wafer GLW, base wafer GBW, and crystal wafer VW are each, for example, four inches in diameter. Each wafer has an orientation flat 10c used for accurately aligning the wafers with each other. The three wafers when layered into a sandwich are bonded together by anodic bonding. Specifically, the sandwich is pressed together while being heated to 200° C. to 400° C. in a vacuum or inert-gas environment. Then, the upper surface of each lid 10A is connected to a negative potential and the upper surface of each outer portion 61 and the lower surface of each metal film 63 are connected to a positive potential. Specifically, for anodic bonding, 400 VDC is applied from a source 90 for ten minutes. After completion of anodic bonding, the first through-hole 41A and second through-hole 43A are sealed in a vacuum or inert gas environment, which results in the interior of the crystal device 120 being evacuated or filled with an inert gas.

After bonding, the resulting package wafer (sandwich) is cut into individual crystal devices 120 using a dicing blade 51. The cutting grooves 15, 19, formed on the lid wafer GLW and base wafer GBW, respectively, are dimensioned so that cutting yields individual piezoelectric devices having desired sizes. The technique used for cutting the package wafer is the same as described in connection with FIG. 4, in which the package wafer is cut into individual crystal devices 120 using a dicing blade 51. As a result of the cutting grooves 49 being formed on the surface of the wafer facing the dicing sheet, the dicing blade 51 can cut the wafer without cutting into the dicing sheet 50. Thus, the package wafer is cut to produce multiple piezoelectric devices having a desired size without producing any chips or other debris that could cause chipping or cracking of base wafer GBW.

Third Embodiment of a Crystal Device 150

Figure 9A:
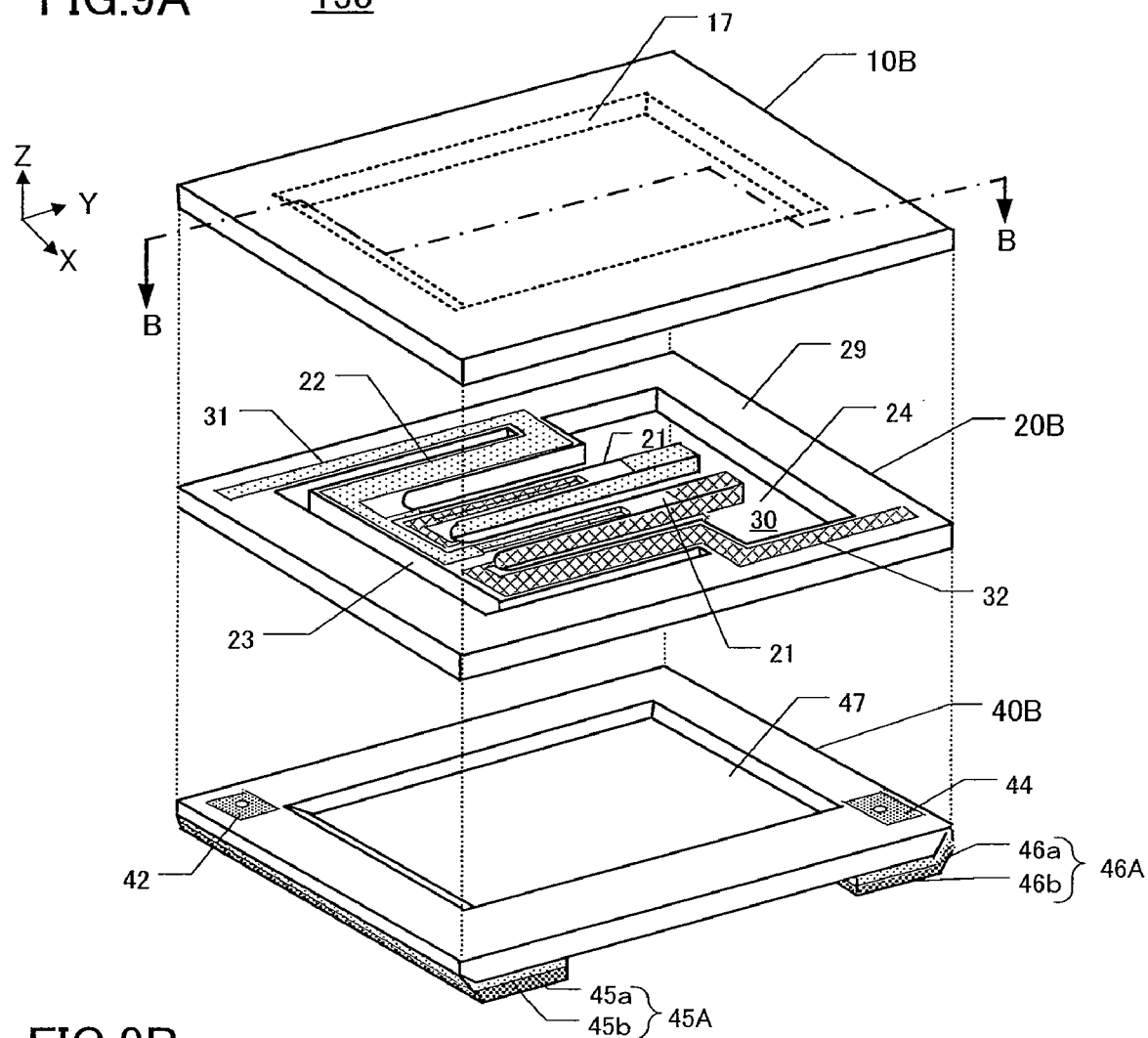
FIG. 9A is a perspective view of a crystal device according to a third embodiment.
Figure 9B:
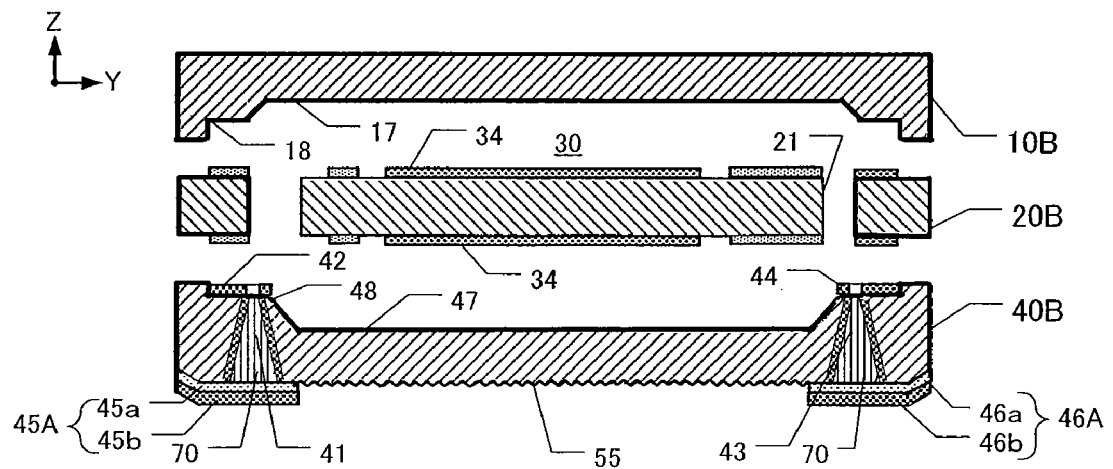
FIG. 9B is an elevational section along the line B-B in FIG. 9A.

FIG. 9A is a perspective view of a third embodiment of a crystal device 150 comprising a tuning-fork type crystal vibrating piece 30. The tuning-fork type crystal vibrating piece 30 comprises an outer frame portion 29 that surrounds the base portion 23 and the vibrating arms 21. The base portion 23 is connected to the outer frame portion 29 by connecting portions 26 extending from respective supporting arms 22. The tuning-fork type crystal vibrating piece 30 and the outer frame portion 29 together form a crystal frame 20B. FIG. 9A is an exploded view of the crystal device 150 as viewed from above and aside from the lid. FIG. 9B is a cross-sectional view along the line B-B in FIG. 9A.

As shown in FIG. 9A, the crystal device 150 of this embodiment comprises a lid 10B, a crystal frame 20B, and a base 40B. The lid 10B and the base 40B are made of crystal material. The crystal frame 20B includes the tuning-fork type crystal vibrating piece 30, formed by etching. One way in which the crystal device 150 of this embodiment differs from the crystal device 100 of the first embodiment is that this embodiment includes slanted surfaces (described below in connection with FIG. 14) formed on the dicing line of the base 40B. Another difference is that the external electrodes are formed on the slanted surface on the bottom after sand-blasting the bottom of the base 40B. Then, the external electrodes are plated.

Referring to FIG. 9B, the through-holes 41, 43 are filled and sealed by a sealing material 70. On the lower surface of the base 40B, a roughened surface 55 is formed by sand-blasting. Then, a first external electrode 45A (comprising 45a, 45b) and a second external electrode 46A (comprising 46a, 46b) are formed. The first external electrode 45A and the second external electrode 46A are each formed of two layers: First, a metal film is formed by sputtering on the entire roughened surface 55. Then, a first external electrode substrate 45a and a second external electrode substrate 46a are formed by photolithography on selected locations on the metal film. Then, on the first external electrode substrate 45a and the second external electrode substrate 46a, a first external electrode plating film 45b and a second external electrode plating film 46b, respectively, are formed by wet-type metal plating. (The method for manufacturing the external electrodes is described later below with reference to FIGS. 14-17.)

Figure 10A:
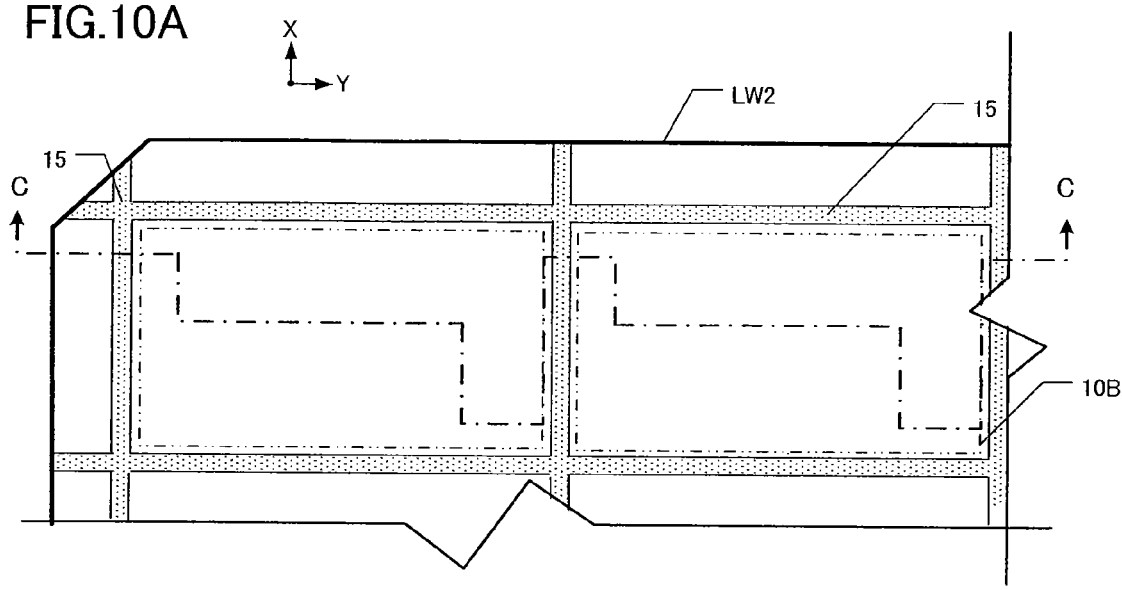
FIG. 10A is a plan view of the top (outer) surfaces of two lids on a lid wafer.
Figure 10B:
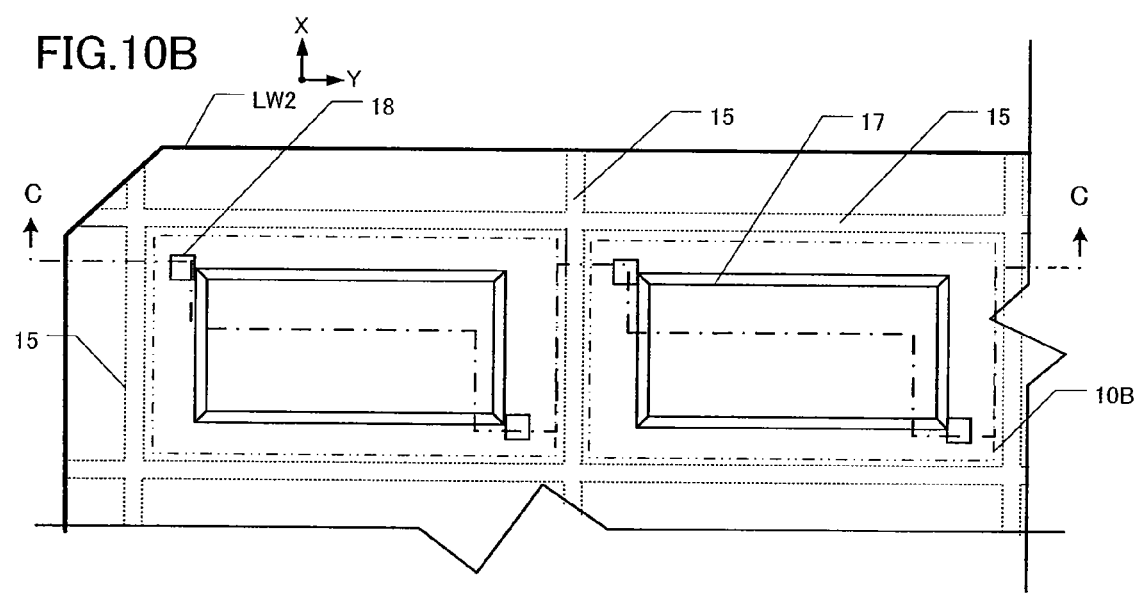
FIG. 10B is a plan view of the inner surfaces of two lids on a lid wafer.
Figure 10C:
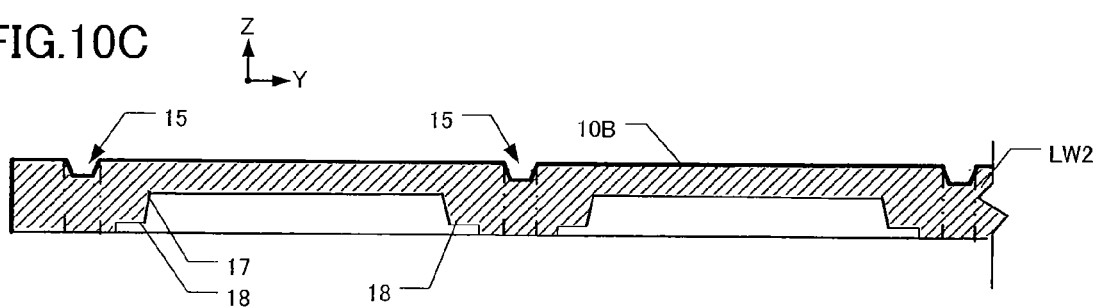
FIG. 10C is an elevational section along the line C-C line in FIG. 10A.

FIG. 10A is a top (outside) view of a lid wafer LW2, FIG. 10B is a view of the inner surface of the lid wafer LW2, and FIG. 10C is a cross-sectional view along the line C-C in FIG.

10A. For convenience of explanation, areas corresponding to the profile of the lid 10B are denoted using a virtual line (two-dot chain line).

In FIG. 10A, the cutting groove 15 is formed on the lid wafer LW2. The cutting groove 15 is formed in a way that avoids formation of cracks in the crystal devices 150 when the package wafer is being cut using a dicing blade. The dicing blade moves linearly so that the cutting groove 15 of the lid wafer LW2 is formed around the periphery of the lid wafer LW2.

FIG. 10B is a view of the inner surface of the lid wafer LW2. The lid wafer LW2 defines concavities 17 and step portions 18. Each concavity 17 and step portion 18 is formed by wet-etching. FIG. 10C is a cross-sectional view along the line C-C in FIG. 10A. The concavities 17 and cutting grooves 15 are formed concurrently by wet-etching.

Figure 11A:
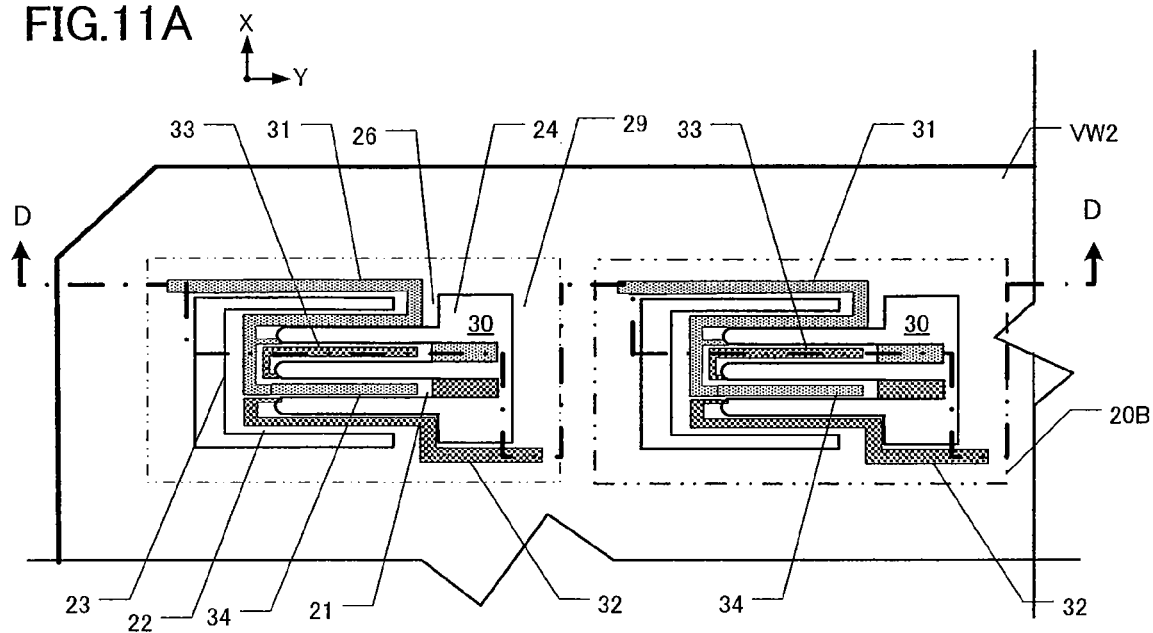
FIG. 11A is plan view of a portion of a crystal wafer, showing two vibrating pieces.
Figure 11B:
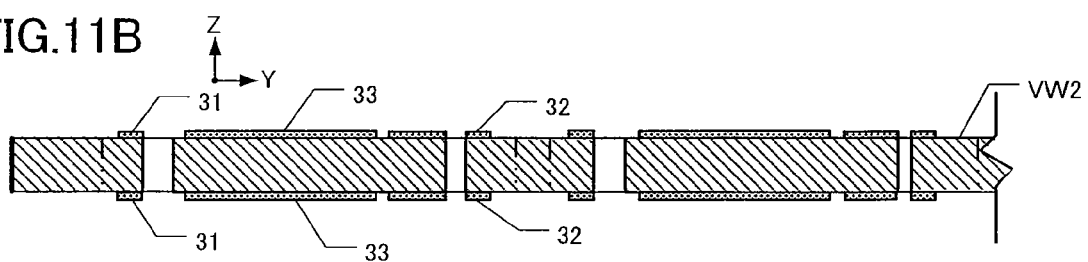
FIG. 11B is an elevational section along the line D-D in FIG. 11A.

FIG. 11A is a top view of a crystal wafer VW2 defining multiple vibrating pieces, and FIG. 11B is a cross-sectional view along the line D-D in FIG. 11A. In FIG. 11A, for convenience of explanation, areas the profiles of the crystal frames 20B are denoted using virtual lines (two-dot chain lines). As shown in FIG. 11A, the crystal frame 20B includes the tuning-fork type crystal vibrating pieces 30 and respective outer frame portions 29. A void 24 is situated between each tuning-fork type crystal vibrating piece 30 and respective outer frame portion 29. The void 24 defines the profile of the tuning-fork type crystal vibrating piece 30, and is formed by wet-etching. The tuning-fork type crystal vibrating piece 30 has the same thickness as the outer frame portion 29. As shown in FIGS. 11A and 11B, the base electrode and excitation electrode are formed on both the upper and lower surfaces of the crystal frame 20B. The vibrating arms 21 have constant width at their distal ends. Except for the shape of the distal ends of the vibrating arms 21 in this embodiment, the crystal frame of this embodiment has the same configuration as the crystal frame 20 of the crystal device 100 of the first embodiment. As a result, the same reference numerals are used to denote respective components that correspond to respective components in the first embodiment.

Figure 12A:
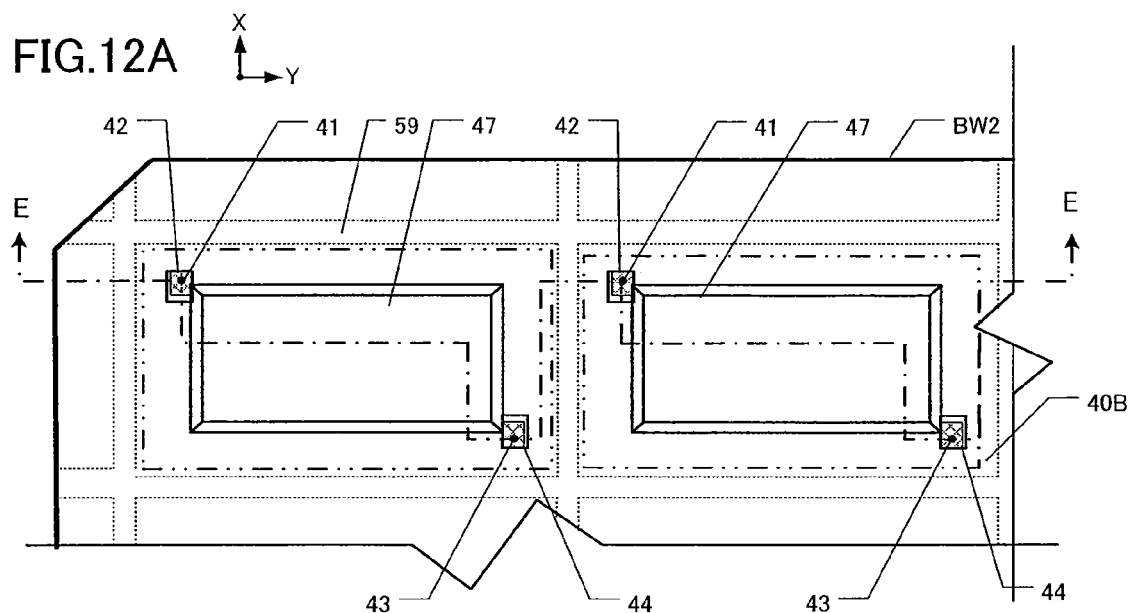
FIG. 12A is a plan view of the inner surface of a portion of a base wafer.
Figure 12B:
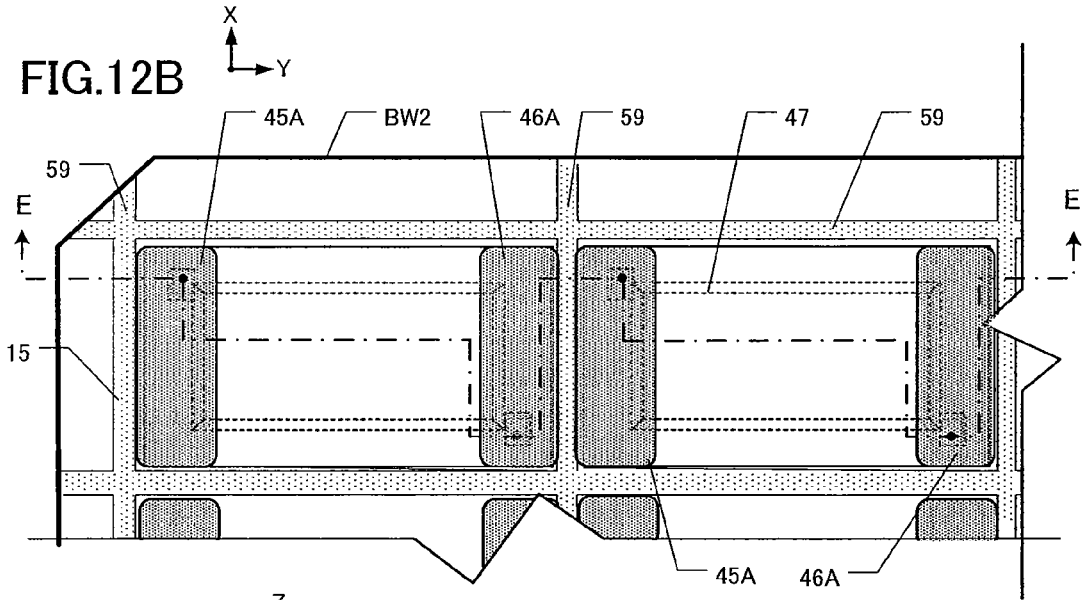
FIG. 12B is a plan view of the outer surface of two bases as formed on a base wafer.
Figure 12C:
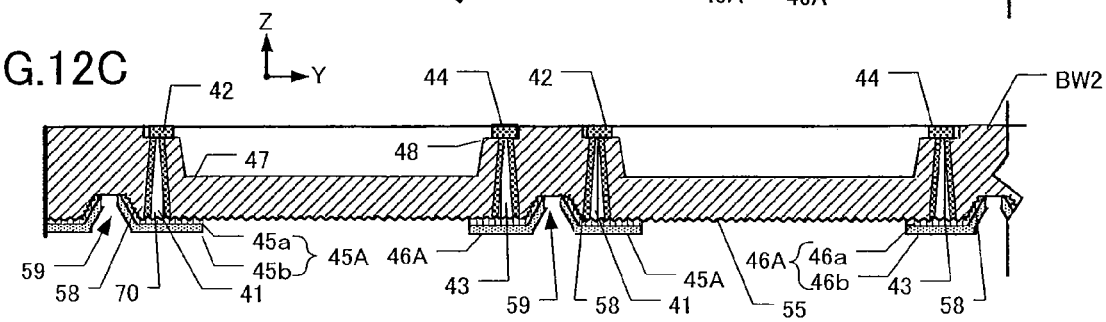
FIG. 12C is an elevational section along the line E-E in FIG. 12A.

FIG. 12A is a top view of the base wafer BW2, FIG. 12B is a rear view of the base wafer BW2, and FIG. 12C is a cross-sectional view along the line E-E (in FIG. 12A) of the base wafer BW2 of this embodiment. For better understanding, in FIG. 12A, areas corresponding to the profile of the base 40B are illustrated using virtual lines (two-dot chain lines). In FIG. 12A, each base 40B formed on the base wafer BW2 has a concavity 47 and step portions 48 (FIG. 12C) on its upper surface for connecting electrodes. Whenever the concavities 47 and step portions 48 are formed by wet-etching, a first through-hole 41 and a second through-hole 43 are also formed at the same time. A first connecting electrode 42 and a second connecting electrode 44 are formed on the step portion 48 for connecting to the respective electrodes formed on the upper surface of the base 40B.

As shown in FIG. 12B, cutting grooves 59 are formed on the lower surface of the base wafer BW2. During formation of the concavities 47 by wet-etching, the cutting grooves 59 are formed in a grid pattern corresponding to the size of the bases 40B out to the periphery of the base wafer BW2. As shown in FIG. 12C, the cutting groove 59 has large tapered portions 58. A first external electrode 45A and second external electrode 46A are also formed on the lower surface of the base 40B and the tapered portions 58. Thus, when the crystal device 150 is mounted on a printed circuit board (not shown) using solder, the solder builds up in the upward (Z-axis) direction and contacts the first external electrode 45A and the second external electrode 46A formed at the taper portion 58 so that the solder strongly adheres to the printed circuit board and the first and second external electrodes 45A, 46A.

Figure 13:
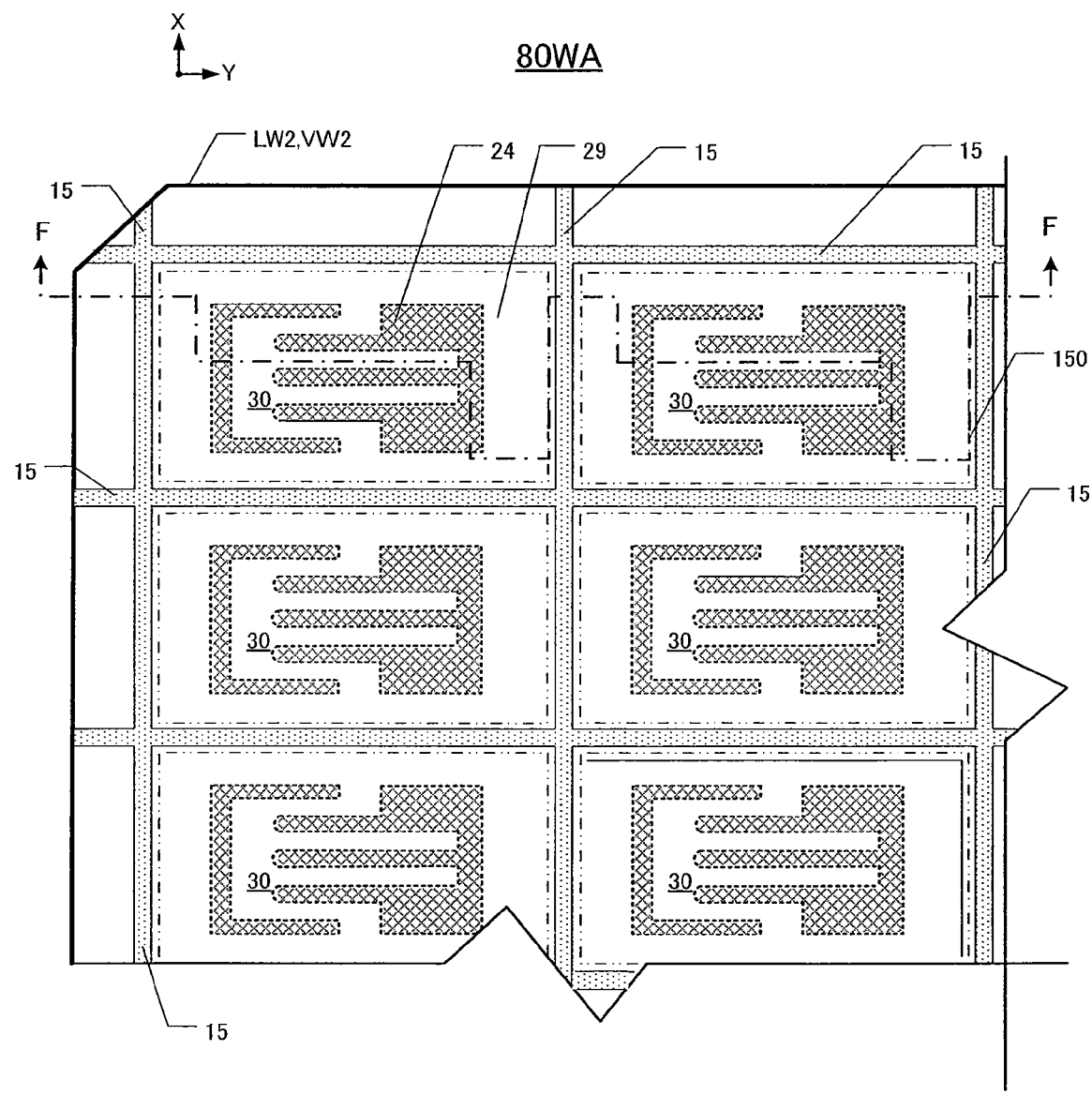
FIG. 13 is a plan view of the top surface of a package wafer as viewed from above the lid wafer.

FIG. 13 is a top view of a package wafer 80WA viewed from above the lid wafer LW2. In FIG. 13, the lid wafer LW2 is depicted as if it were transparent, which allows the tuning-fork type crystal vibrating pieces 30 of the crystal wafer VW2 to be mainly illustrated. For convenience in describing the package wafer 80WA, regions corresponding to the profile of the crystal device 150 are illustrated using virtual lines (two-dot chain lines). The tuning-fork type crystal vibrating pieces 30 of the crystal frame 20B are denoted using dotted lines, and the voids 24 are denoted by shaded areas.

In FIG. 13, cutting grooves 15 are formed on the lid wafer LW2. On the base wafer BW2 (see FIG. 14), cutting grooves 59 that are wider than the cutting grooves 15 are formed at the same positions (in the X-Y plane) of the cutting grooves 15 formed on the lid wafer LW2.

Figure 14:
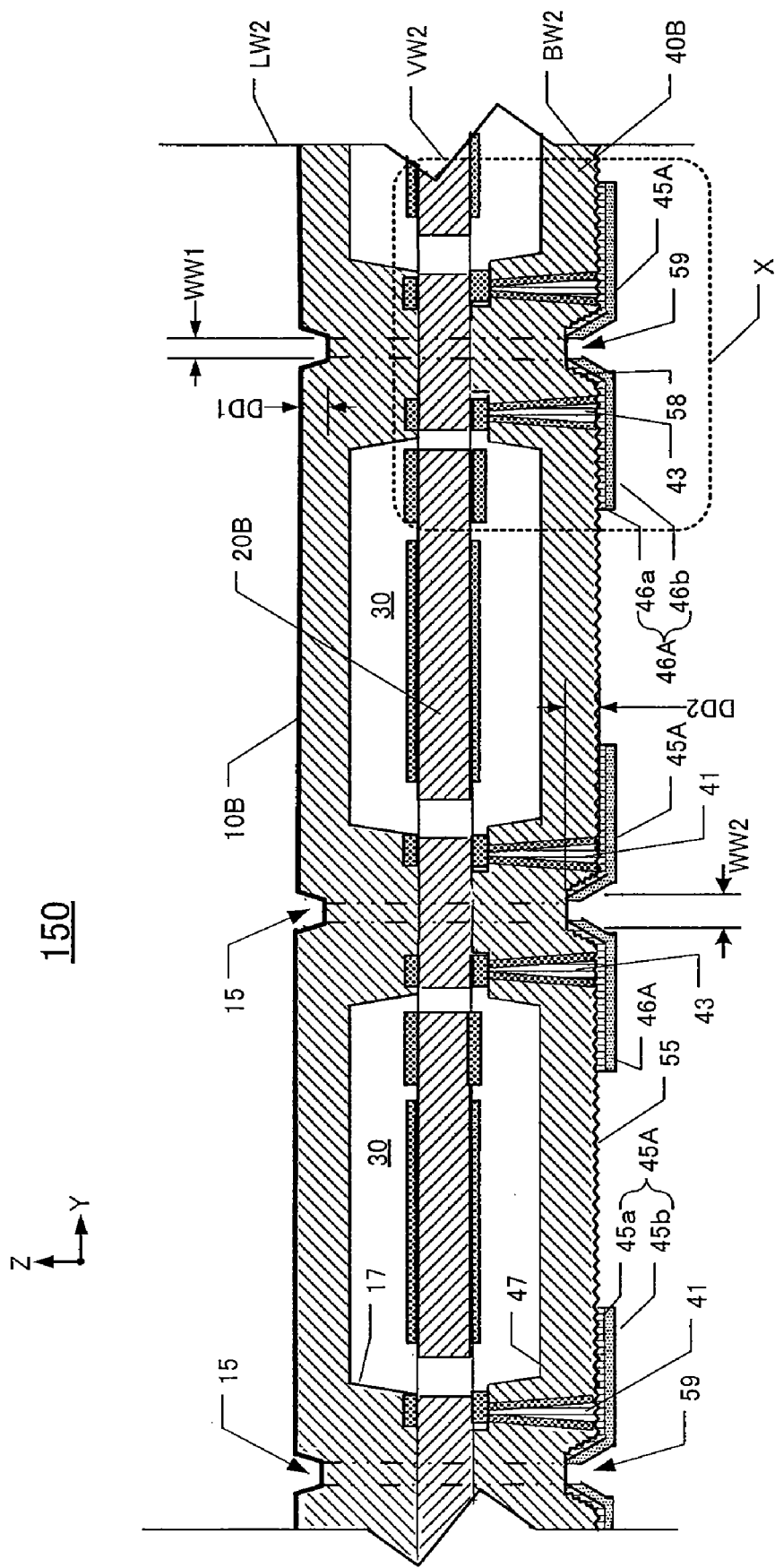
FIG. 14 is an elevational section along the line F-F in FIG. 13.

FIG. 14 is an enlarged cross-sectional view along the line F-F in FIG. 13. In FIG. 14 the package wafer 80WA of the crystal devices 150 comprises a crystal lid wafer LW2, a crystal wafer VW2 defining the vibrating pieces, and a crystal base wafer BW2. The lid wafer LW2 and the base wafer BW2 have a thickness of 100 µm and 150 µm, respectively, and include respective cutting grooves 15, 59 placed to correspond to the size of the third crystal devices 150. For convenience in describing the package wafer 80WA, areas corresponding to the profile of the crystal device 150 are illustrated with virtual lines (two-dot chain lines).

The depth DD1 of the cutting groove 15 is in the range of 20 µm to 70 µm. The width WW1 of the cutting groove 15 is almost equal to or slightly wider than the thickness of the cutting edge of a dicing blade, as explained later below. The depth DD2 and the width WW2 of the cutting groove 59 are each greater than of the cutting groove 15. The depth DD2 of the cutting groove 59 is in the range of 30 µm to 100 µm. Taper portions 58 having a slanted cross-section are formed on the both sides of the cutting groove 59. A metal film for an external electrode is formed on the taper portions 58. The width WW2 of the cutting groove 59 is 1.2 to 1.5 times greater than the width WW1 of the cutting groove 15. Since the cutting grooves 15 and 59 are formed by etching, each groove widens from inside to outside in the Z-direction.

The first through-hole 41 and second through-hole 43 of the base wafer BW2 are sealed using sealing material 70. After sealing these through-holes, the lower surface of the base wafer BW2 is roughened 55 by sand-blasting. After forming a metal film on the entire surface of the rough surface 55 by sputtering, a first external electrode ground film 45a and a second external electrode ground film 46a are formed over the tapered portions 58 of the cutting groove 59 by photolithography. However, the first external electrode ground film 45a and the second external electrode ground film 46a are not formed on the surface to be cut by the dicing blade 51.

A first external electrode plating film 45b and a second external electrode plating film 46b are formed on the first external electrode ground film 45a and the second external electrode ground film 46a, respectively, by wet-type metal plating. As a result, each of the first external electrode 45A and the second external electrode 46A comprises two layers having taper portions 58. When the crystal device 150 is mounted on a printed circuit board or a flexible circuit board (not shown) using solder, the solder builds up and contacts the first external electrode 45A and the second external electrode 46A of the taper portion 58. Thus, the solder strongly affixes the first external electrode 45A and second external electrode 46A to the printed circuit board.

Figure 15:
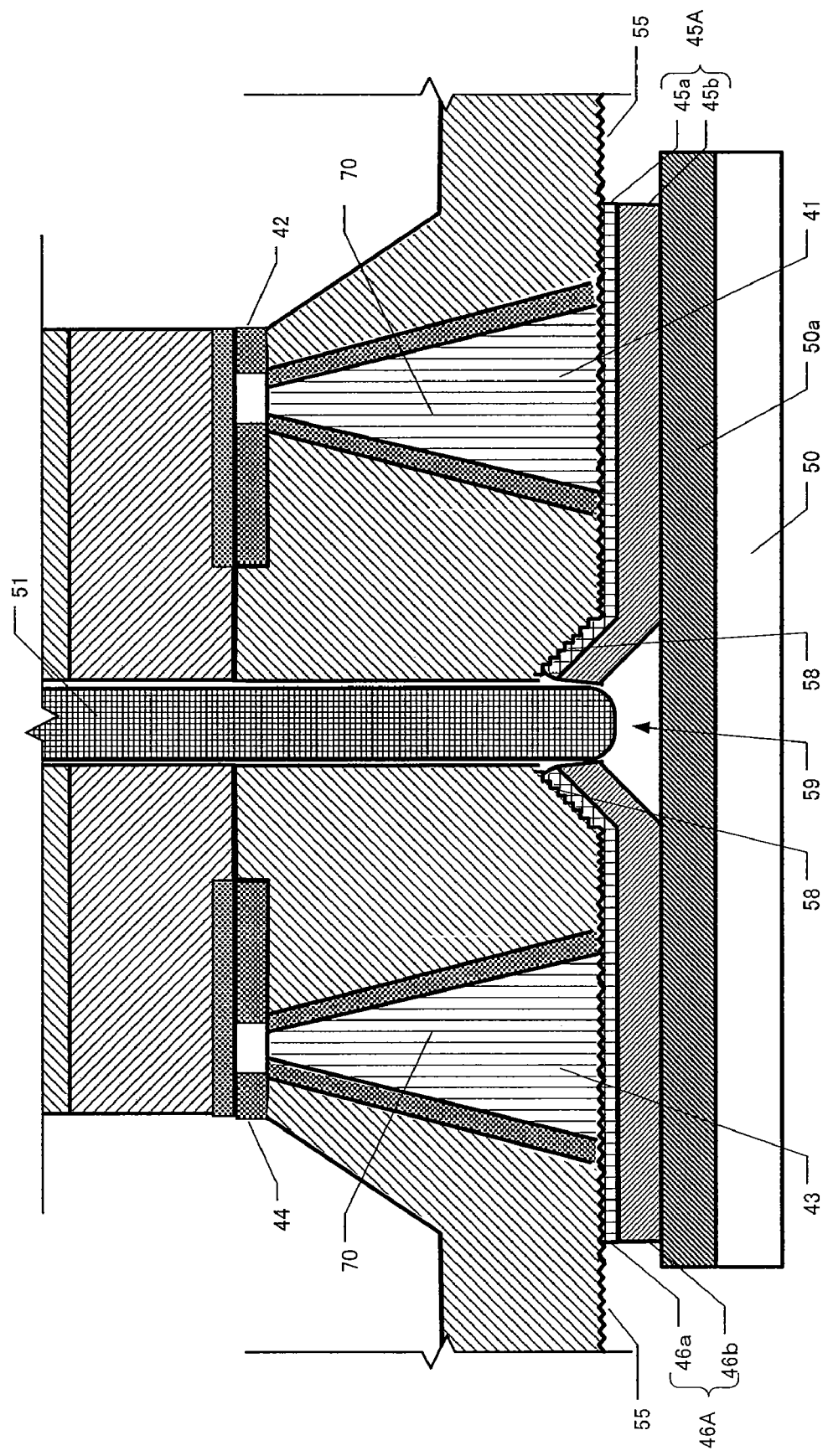
FIG. 15 is an enlarged elevational view of the region denoted "X" in FIG. 14.

FIG. 15 is an enlarged cross-sectional view of the region denoted "X" in FIG. 14. The package wafer 80WA is affixed to a dicing sheet 50 by an adhesive 50a and cut using a dicing blade 51. A space is formed between the adhesive 50a of the dicing sheet 50 and the cutting groove 59. As shown in FIG. 15, the space allows the edge of the dicing blade 51 to cut the packaged wafer 80WA without touching either the dicing sheet 50 or the adhesive 50a. As a result, chips of crystal material are not generated during cutting, and no burrs or chips are deposited on the package wafer 80WA comprising the crystal devices 150.

Method for Manufacturing Crystal Device 150

Figure 16:
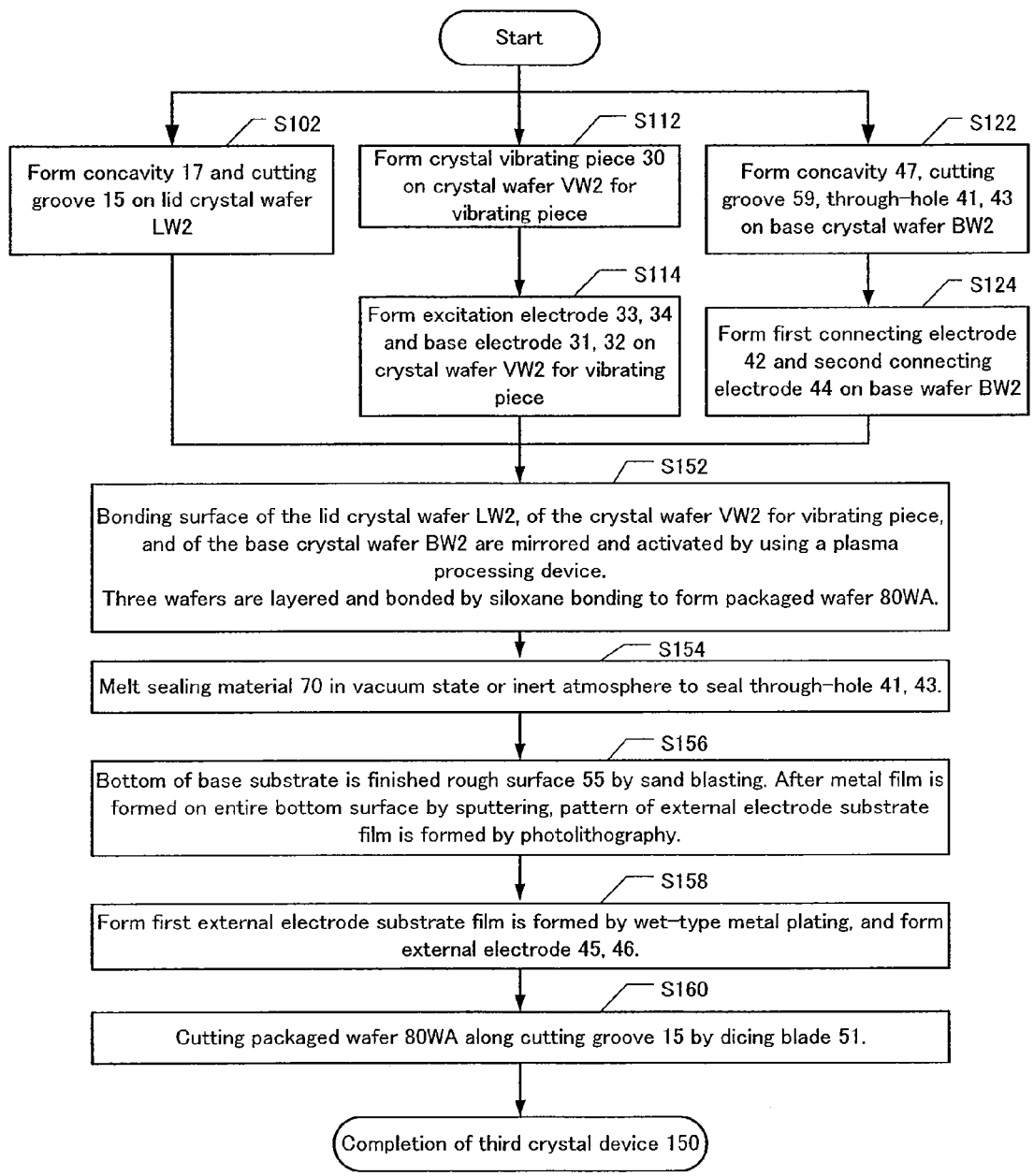
FIG. 16 is a flow-chart of a first embodiment of a method for manufacturing external electrodes in crystal devices according to a third embodiment.

An embodiment of a method for manufacturing the crystal devices 150 is described below with reference to FIG. 16, which is a flow-chart of the method. FIG. 17 is a flow chart of a second method embodiment. Turning first to FIG. 16, step S102 involves forming the lid crystal wafer LW2. Steps S112 and S114 involve forming the crystal frame wafer VW2 for the vibrating pieces. Steps S122 and S124 involve forming the base crystal wafer BW2. Step S152 and subsequent steps involve layering the three wafers as a sandwich, bonding them together, and cutting them to form individual devices. More specifically, in step S102 multiple lids 10B each including a respective concavity 17 and cutting grooves 15 are formed on the lid crystal wafer LW2. Hundreds to thousands of lids 10B are formed on the lid crystal wafer LW2. In step S112 the crystal frames 20B each including a respective crystal vibrating piece 30 are formed on the crystal frame wafer VW2 by wet-etching. Hundreds to thousands of frames 20B are formed on the crystal frame wafer VW2. In step S114 respective excitation electrodes 33, 34, and base electrodes 31, 32 are formed on each crystal vibrating piece 30 formed on the crystal frame wafer VW2. In step S122 multiple bases 40B each including a respective concavity 47, cutting grooves 59, and first and second through-holes 41, are formed on the base crystal wafer BW2. Hundreds to thousands of bases 40B are formed on the base crystal wafer BW2. In step S124 the respective first and second connecting electrodes 42, 44 are formed on the base wafer BW2.

In step S152 the bonding surfaces of the lid crystal wafer LW2, crystal frame wafer VW2, and base crystal wafer BW2 are mirrored and cleaned in preparation for siloxane bonding. The bonding surfaces desirably are activated using a plasma processing device that provides an RIE (reactive-ion etching) system of the SWP (surface-wave-plasma) type. By aligning the three wafers with each other, the respective activated bonding surfaces of each lid 10B, each crystal frame 20B, and each base 40B are brought into registration in the three-wafer sandwich. The layers of the sandwich are heated slightly (approximately 100° C.) and pressed together. As a result, the wafers of the sandwich are strongly bonded together by siloxane bonding to form the package wafer 80WA.

In step S154, a first through-hole 41 and a second through-hole 43 of the packaged wafer 80WA are sealed by molten sealing material 70 in a vacuum inert-atmosphere environment. The sealing material 70 desirably is applied on each through-hole as a eutectic metal ball. Example eutectics include but are not limited to gold-silicon alloys (e.g., $Au_{3.15}Si$) and gold-germanium alloys (e.g., $Au_{12}Ge$).

In step S156 the entire lower surface of the base wafer of the package wafer 80WA, particularly where the through-holes are sealed, is roughened 55 by sand-blasting. Next, the respective first and second external electrode ground films 45a, 46a are formed using photolithography. They are also formed on the taper portions 58 of the cutting grooves 59.

In step S158 a plating film is formed by wet-etching on the package wafer 80WA already including first and second external electrode ground films 45a, 46a previously formed by wet-type metal plating. The first and second external electrodes 45A, 46A included the first external electrode plating film 45b and the second external electrode plating film 46b.

In step S160 the package wafer 80WA including external electrodes is cut by the dicing blade 51 along the cutting grooves 15. Since the cutting edge of the dicing blade 51 can cut the wafer without touching the dicing sheet 50 or the adhesive 50a, the package wafer 80WA (including the crystal devices 150) does not generate any chips or burrs. The first external electrode 45 and second external electrode 46A are also formed on the taper portions 58 formed on the lower surface of the package wafer 80WA.

FIG. 17 is a flow-chart of a second embodiment of a method for manufacturing the crystal device 150. Step S202 is directed to forming the lid crystal wafer LW2. Steps S212 and S214 involve forming the crystal wafer VW2 for vibrating pieces. Steps S222 and S224 are directed to forming the base crystal wafer BW2. Steps S252 and later steps pertain to layering the wafers and thus forming a three-wafer sandwich in which the wafers are bonded together. In step S202 multiple lids 10B each having a concavity 17 and cutting grooves 15 are formed on the lid crystal wafer LW2. In step S212, multiple crystal frames 20B each including a respective crystal vibrating piece 30 are formed on a crystal frame wafer VW2 by wet-etching. In step S214 base electrodes 31, 32, and excitation electrodes 33, 34 are formed on the respective crystal vibrating piece 30 of each crystal frame 20B on the crystal frame wafer VW2. In step S222 multiple bases 40B each including a respective concavity 47, cutting grooves 59, first through-hole 41, and second through-hole 43, are formed on the base crystal wafer BW2. In step S224 respective first and second connecting electrodes 42 are formed on each base 40B on the base wafer BW2. In step S226 the first and second through-holes 41, 43 are sealed by applying and melting sealing material 70. The sealing material 70 is a eutectic metal applied on each through-hole as a respective ball. Example eutectics are gold-silicon alloy ($Au_{3.15}Si$) and gold-germanium alloy ($Au_{12}Ge$).

In step S252 the bonding surfaces of the lid crystal wafer LW2, crystal frame wafer VW2, and base crystal wafer BW2 are mirrored and cleaned for subsequent siloxane bonding. The bonding surfaces can be activated using a plasma processing device. The activated bonding surfaces of the lid crystal wafer LW2, crystal frame wafer VW2, and base crystal wafer BW2 are aligned with each other (using, e.g., the orientation flat, not shown) and layered to form the three-wafer sandwich.

In step S254 the three-layer sandwich is heated to a relatively low temperature (e.g., approximately 100° C. to 200° C. and pressed together. This causes the wafers to be bonded strongly together by siloxane bonding, thereby forming the sandwiched package wafer 80WA.

In step S256 the entire lower surface of the package wafer 80WA is roughened, including locations at which the through-holes are sealed, by sand-blasting, thereby forming the roughened surface 55. In step S258 a metal mask defining the locations and configurations of the external electrodes is placed on the roughened surface 55 to form a metal film by sputtering. Upon removing the metal mask the first and second external electrode ground films 45a, 46a are formed.

In step S260, a plating film is formed on the packaged wafer 80WA (which now includes the first and second external electrode ground films 45a, 46a) by wet-type metal plating. Thus, the first and second external electrodes 45A, 46A have respective first and second external electrode plating films 45b, 46b.

In step S262 the package wafer 80WA (now including external electrodes) is cut using a dicing blade 51 along the cutting grooves 15.

The invention has been described above in the context of preferred embodiments. It will be understood by those of ordinary skill in the art that the invention can be varied and/or modified within the scope of this invention. For example, the cutting grooves 15, 49, and 59 are described in the various embodiments as being formed by wet-etching. Alternatively, the cutting grooves can be formed by sand-blasting. Also, the various crystal frames of the described embodiments can alternatively be made of any of various piezoelectric materials other than crystal (quartz crystal), such as lithium niobate.

What is claimed is:

1. A method for manufacturing a piezoelectric device, comprising:
   on a base substrate, forming an array of device bases separated one from the other by cutting grooves defined on one surface of the base substrate, the cutting grooves having tapered sides and extending depthwise into the base substrate, the cutting grooves defining therebetween a size of a piezoelectric vibrating device of the array;
   on a frame substrate made of a piezoelectric material, forming an array, corresponding to the array of device bases, of device frames each being of the size and surrounding a respective piezoelectric vibrating piece;
   on a lid substrate, forming an array, corresponding to the array of device bases, of device lids each being of the size;
   sandwiching the frame substrate between the base substrate and lid substrate with the device bases, device frames, and device lids being aligned with each other and with the surface defining the cutting grooves facing outward;
   bonding the sandwiched frame substrate to the base substrate and lid substrate to form a package substrate comprising multiple piezoelectric devices;
   forming a metal film extending from the one surface to the tapered sides;
   plating the metal film to define at least one external electrode for each piezoelectric vibrating device of the array;
   mounting the base substrate on a dicing sheet such that the surface including the cutting grooves faces the dicing sheet; and
   using a dicing blade, cutting depthwise through the package substrate from the lid substrate to the cutting grooves.

2. The method of claim 1, wherein:
   the dicing blade includes a cutting edge; and
   cutting is limited depthwise in the package substrate so that the cutting edge of the dicing blade does not touch the dicing sheet.

3. The method of claim 2, wherein the piezoelectric vibrating piece is a tuning-fork type piezoelectric vibrating piece or an AT-cut vibrating piece.

4. The method of claim 1, wherein the piezoelectric vibrating piece is a tuning-fork type piezoelectric vibrating piece or an AT-cut vibrating piece.

5. The method of claim 1, wherein:
   the base substrate and lid substrate are each made of a glass material; and
   bonding comprises anodic bonding.

6. The method of claim 1, wherein:
   the base substrate and lid substrate are each made of a piezoelectric material; and
   bonding comprises siloxane bonding.

7. The method of claim 1, wherein the cutting grooves are formed by etching.

8. The method of claim 1, wherein:
   the base substrate defines multiple through-holes;
   the method further comprises, after bonding, sealing the through-holes using a eutectic metal; and
   sealing is performed in a vacuum environment or inert-gas atmosphere.

9. The method of claim 1, further comprising roughening the one surface before forming the metal film.

10. The method of claim 9, wherein the metal film is not formed on regions of the one surface destined to be cut by the dicing blade.

11. The method of claim 1, wherein the metal film is not formed on regions of the one surface destined to be cut by the dicing blade.

12. A method for manufacturing a piezoelectric device, comprising:
    on a lid substrate forming multiple lids for respective piezoelectric devices, the lids being separated from each other on the lid substrate by respective cutting grooves defined in a surface of the lid substrate, the cutting grooves defining the size of the piezoelectric devices;
    on a frame substrate made of a piezoelectric material, forming multiple frames for respective piezoelectric devices, each frame being of the size, surrounding a respective piezoelectric vibrating piece, and being alignable with a respective lid on the lid substrate;
    on a base substrate forming multiple bases for the respective piezoelectric devices, each base being of the size and being alignable with a respective lid on the lid substrate and with a respective frame on the frame substrate, and the base substrate forming an array of device bases separated one from the other by cutting grooves defined on one surface of the base substrate, the cutting grooves having tapered sides and extending depthwise into the base substrate, the cutting grooves defining therebetween a size of a piezoelectric vibrating device of the array;
    forming a substrate sandwich in which the frame substrate is situated between and aligned with the lid and base substrates, and the cutting grooves face outward;
    bonding the frame substrate to the lid substrate and base substrate to form a package substrate having a thickness;
    forming a metal film extending from the one surface of the base substrate to the tapered sides of the base substrate;
    plating the metal film to define at least one external electrode for each piezoelectric vibrating device of the array;
    after bonding, mounting the lid substrate on a dicing sheet such that the surface defining the cutting grooves faces the dicing sheet; and
    using a dicing blade, cutting through a thickness from the base substrate to the cutting grooves of the lid substrate but without cutting the dicing sheet.

13. The method of claim 12, wherein cutting comprises controlling a cutting position of the dicing blade to prevent cutting completely through the thickness of the package substrate while cutting at least to a top of the cutting grooves of the lid substrate on the dicing sheet.

14. The method of claim 12, wherein the piezoelectric vibrating pieces are tuning-fork type piezoelectric vibrating pieces or AT-cut vibrating pieces.

15. The method of claim 12, wherein:

the base substrate and lid substrate are each made of a glass material; and bonding comprises anodic bonding.

16. The method of claim 12, wherein:

the base substrate and lid substrate are each made of a piezoelectric material; and bonding comprises siloxane bonding.

17. The method of claim 12, wherein the cutting grooves are formed by etching.

18. The method of claim 12, further comprising:

the base substrate defines multiple through-holes;

the method further comprises, after bonding, sealing the through-holes using a eutectic metal; and sealing is performed in a vacuum environment or inert-gas atmosphere.

* * * * *